(12) United States Patent
Luk et al.

(10) Patent No.: US 7,543,283 B2
(45) Date of Patent: Jun. 2, 2009

(54) FLEXIBLE INSTRUCTION PROCESSOR SYSTEMS AND METHODS

(75) Inventors: Wayne Luk, London (GB); Peter Y. K. Cheung, London (GB); Shay Ping Seng, Singapore (SG)

(73) Assignee: Imperial College Innovations Limited, London (GB)

( * ) Notice: Subject to any disclaimer, the term of this patent is extended or adjusted under 35 U.S.C. 154(b) by 762 days.

(21) Appl. No.: 10/416,977
(22) PCT Filed: Nov. 19, 2001
(86) PCT No.: PCT/GB01/05080

§ 371 (c)(1),
(2), (4) Date: Oct. 30, 2003

(87) PCT Pub. No.: WO02/41146

PCT Pub. Date: May 23, 2002

(65) Prior Publication Data

US 2004/0073899 A1   Apr. 15, 2004

(30) Foreign Application Priority Data

Nov. 17, 2000   (GB)   ................................. 0028079.2

(51) Int. Cl.
*G06F 9/45* (2006.01)
*G06F 15/76* (2006.01)
*G06F 17/50* (2006.01)
*G06F 1/24* (2006.01)

(52) U.S. Cl. ........................... 717/153; 712/37; 712/15; 716/17; 713/100

(58) Field of Classification Search .................. 717/153; 712/15, 37; 716/17; 713/100
See application file for complete search history.

(56) References Cited

U.S. PATENT DOCUMENTS 4,763,242 A * 8/1988 Lee et al. ...................... 703/27

(Continued)

FOREIGN PATENT DOCUMENTS

WO   WO 0031652 A2 * 6/2000

(Continued)

OTHER PUBLICATIONS

Fisher, "Customized Instruction-Sets For Embedded Processors", Jun. 1999, pp. 253-257, Annual ACM IEEE Design Automation Conference, http://delivery.acm.org/10.1145/310000/309923/p253-fisher.pdf?key1=309923&key2=1784913711&coll=portal&dl=ACM&CFID=13023017&CFTOKEN=25526404.*

(Continued)

*Primary Examiner*—Wei Y Zhen
*Assistant Examiner*—Chih-Ching Chow
(74) *Attorney, Agent, or Firm*—Renner, Otto, Boisselle & Sklar LLP

(57) ABSTRACT

The present invention relates to the design-time and run-time environments of instruction processors implemented in re-programmable hardware. In one aspect the present invention provides a design system for generating configuration information and associated executable code base on a customization specification, which includes application information including application source code and customization information including design constraints, for implementing an instruction processor using re-progammable hardware, the system comprising: a template generator; an analyzer; a compiler; an instantiator, and a builder. In another aspect the present invention provides a management system for managing run-time re-configuration of an instruction processor implemented using re-programmable hardware, comprising: a configuration library; a code library; a loader; a loader controller; a run-time monitor; an optimization determiner; and an optimization instructor.

26 Claims, 12 Drawing Sheets

U.S. PATENT DOCUMENTS

| | | | | |
|---|---|---|---|---|
| 5,740,466 | A | * | 4/1998 | Geldman et al. ............... 710/5 |
| 5,752,035 | A | * | 5/1998 | Trimberger ................. 717/153 |
| 5,809,321 | A | * | 9/1998 | Hansen et al. ................. 712/1 |
| 5,812,425 | A | * | 9/1998 | Lee et al. ...................... 702/79 |
| 6,006,318 | A | * | 12/1999 | Hansen et al. ................ 712/28 |
| 6,138,229 | A | * | 10/2000 | Kucukcakar et al. .......... 712/37 |
| 6,477,683 | B1 | * | 11/2002 | Killian et al. .................. 716/1 |
| 6,477,697 | B1 | * | 11/2002 | Killian et al. ................. 716/18 |
| 6,658,564 | B1 | * | 12/2003 | Smith et al. ................. 713/100 |
| 6,664,988 | B1 | * | 12/2003 | Rollins ....................... 715/853 |
| 6,725,317 | B1 | * | 4/2004 | Bouchier et al. ............ 710/312 |
| 6,789,135 | B1 | * | 9/2004 | Yamamoto et al. ............. 710/8 |
| 7,036,106 | B1 | * | 4/2006 | Wang et al. .................. 716/18 |
| 2003/0028690 | A1 | * | 2/2003 | Appleby-Alis et al. ......... 710/8 |
| 2004/0016002 | A1 | * | 1/2004 | Handelman et al. ......... 725/152 |

FOREIGN PATENT DOCUMENTS

| | | | |
|---|---|---|---|
| WO | WO 0038087 | A1 * | 6/2000 |
| WO | WO 0046704 | A2 * | 8/2000 |
| WO | WO 0049496 | A1 * | 8/2000 |
| WO | WO 0241146 | A2 * | 5/2002 |

OTHER PUBLICATIONS

Gschwind, "Instruction Set Selection for ASIP Design", Mar. 1999, pp. 7-11, International Conference on Hardware Software Codesign, http://delivery.acm.org/10.1145/310000/301187/p7-gschwind.pdf?key1=301187&key2=8215913711&coll=portal&dl=ACM&CFID=13023353&CFTOKEN=29979890.*

Shirazi et al., "Framework and tools for run-time reconfigurable designes", May 2000, pp. 147-152, IEEE Xplore, http://ieeexplore.ieee.org/iel5/2192/18668/00860843.pdf?tp=&arnumber=860843&isnumber=18668.*

Kayhan, "An ASIP Design Methodology for Embedded Systems", Mar. 1999, pp. 17-21, International Conference on Hardware Software Codesign, http://delivery.acm.org/10.1145/310000/301190/p17-kucukcakar.pdf?key1=301190&key2=7855913711&coll=portal&dl=ACM&CFID=13023886&CFTOKEN=62208382.*

Seng et al., "Flexible instruction processors", pp. 193-200, Nov. 17-19, 2000, International Conference on Compilers, Architecture and Synthesis for Embedded Systems, http://delivery.acm.org/10.1145/360000/354907/p193-seng.pdf?key1=354907&key2=3578123711&coll=GUIDE&dl=GUIDE&CFID=13052628&CFTOKEN=66045506.*

Saleeba M., "A self-contained dynamically reconfigurable processor architecture" Australian Computer Science Communications, vol. 15, No. 1, Part A, Feb. 3, 1993.*

* cited by examiner

| Devices | CaffineMark Score | Speed-up | |
|---|---|---|---|
| Software JVM (Pentium II, 300 MHz) | 502 | 1 | |
| FIP JVM (Xilinx Virtex, 33 MHz) | 1019 | 2x | 1 |
| Pipelined FIP JVM (estimated) | 3665 | 7x | 3.5x |
| GMJ30501SB Java processor (ASIC, 200 MHz) | 13332 | 27x | 13x |

| Java Opcodes | Chained Opcodes in Custom Instruction |
|---|---|
| ILOAD_1 | paramreg=TOS( ); |
| ICONST_1<br>ISHL | tempreg1=paramreg<<1; |
| ILOAD_1<br>SIPUSH 0x80<br>IAND | tempreg2=param&0x80; |
| IFEQ 0x9 | if (tempreg2==0) jump 3 |
| GETSTATIC 0x4f | tempreg2=0x1b; |
| GOTO 0x4 | jump2 |
| ICONST_0 | tempreg2=0; |
| IXOR | tempreg2=tempreg2^tempreg; |
| INT2BYTE | INT2BYTE |
| IRETURN | IRETURN |

| FIP | Speed-up | |
|---|---|---|
| | Encryption | Decryption |
| AES1 | 1 | 1 |
| AES2 | 1.3 | 3.6 |
| AES3 | 5.2 | 1.4 |
| AES4 | 1.1 | 20.2 |

FLEXIBLE INSTRUCTION PROCESSOR SYSTEMS AND METHODS

This application is a national phase of International Application No. PCT/GB01/05080 filed Nov. 19, 2001 and published in the English language.

The present invention relates to the design-time and run-time environments of re-programmable instruction processors, such instruction processors being referred in the specification as flexible instruction processors (FIPs).

In one aspect the present invention relates to a FIP design system for generating FIP configuration information and associated executable FIP code for FIP implementations based on user-specified customisation specifications, and a related method of generating FIP configuration information and associated executable FIP code for FIP implementations based on user-specified customisation specifications.

In another aspect the present invention relates to a FIP management system for managing the run-time adaptation of the FIP configuration information and associated executable FIP code of a FIP implementation, and a related method of managing the adaptation of the FIP configuration information and associated executable FIP code of a FIP implementation during run-time.

General-purpose instruction processors, such as those from AMD Corporation (US) and Intel Corporation (US), have dominated computing for a long time. However, such processors have fixed architectures, and tend to lose performance when dealing with non-standard operations and non-standard data which are not supported by the instruction set formats [1].

The need for customising instruction processors for specific applications is particularly acute in embedded systems, such as cell phones, medical appliances, digital cameras and printers [2].

It is possible to develop customised integrated circuits for executing programs written in a specific language. An example is the GMJ30501SB processor which is customised for executing the Java language (Helborn Electronics, Segyung, Korea). However, the design and fabrication of such integrated circuits is still expensive, and, once designed, its customised function is fixed and cannot be altered.

Re-programmable hardware, such as Field-Programmable Gate Arrays (FPGAs) from Xilinx Inc. (San Jose, Calif., US) or Complex Programmable Logic Devices (CPLDs) from Altera Corporation (San Jose, Calif. US), provides a means of implementing instruction processors using standard, off-the-shelf components. The use of such devices not only eliminates the risks associated with integrated circuit design and fabrication, but also opens up the possibilities of having a customisable processor.

One route to supporting customisation is to augment an instruction processor with programmable logic for implementing custom instructions. Several vendors are offering a route to such implementations [3-5]. The processors involved are usually based on existing architectures, such as those from ARM, IBM and MIPS. These fixed instruction processor cores are interfaced to programmable logic, which provides the resources for implementing a set of custom instructions for a given application. One such implementation utilises one or more FPGAs as programmable execution units in combination with a defined execution unit [6]. This system includes a data processor which comprises a defined execution unit which is coupled to internal buses of the processor for execution of a pre-defined set of instructions, combined with one or more programmable execution units which are coupled to the internal buses for execution of programmed instructions. This approach does not, however, encompass customising the overall architecture of the defined execution unit and programmable execution units, or the set of tools supporting such customisation.

Another route to supporting customisation of instruction processors is to implement instruction processors using existing FPGAs [7]. With such an implementation, it is possible to customise the entire instruction processor at compile time [8] or at run time [9, 10]. An automated method for instruction processor design and optimisation based on capturing the instruction interpretation process as a parallel program has been developed [11], and a number of instruction processors have been implemented [12-14], although the performance of these processors has not been reported.

A further prior art approach involves methods and tools for the automatic generation of configurable processors at design time [15]. This approach does not, however, encompass methods and tools for the automatic generation of processors customisable both at design and run time.

Automatic methods for producing compile-time and run-time customisable datapaths have also been developed [16], but the instruction set architectures (ISAs) in these designs are fixed, as implemented on a commercial microprocessor, for example, and the architecture is not customisable.

It is an aim of the present invention to provide design-time and run-time environments for flexible instruction processors (FIPs) which provide for user customisation and design-time optimisation, in order to exploit the re-programmability of current and future generations of re-programmable hardware.

Accordingly, the present invention provides a system for and method of automatically generating a customisable processor and the executable processor code. Both the code and the processor can be customised both at design time and run time according to a user-provided customisation specification.

FIPs advantageously provide a means of creating customised processors which can be tuned for specific applications. FIPs are assembled from a skeletal processor template, which comprises modules which are interconnected by communication channels, and a set of parameters. The template can be used to produce different processor implementations, such as different processor styles, for example, stack-based or register-based styles, by varying the parameters for that template, and by combining and optimising existing templates. The parameters for a template are selected to transform a skeletal processor into a processor suited to a particular application. When a FIP is assembled, required instructions are retrieved from a library that contains implementations of these instructions in various styles. Depending on which instructions are included, resources such as stacks and different decode units are instantiated, with the communication channels providing a mechanism for dependencies between instructions and resources to be mitigated.

As compared to a direct hardware implementation, FIPs have the added overheads of instruction fetch and decode. However, FIPs have many advantages.

FIPs allow customised hardware to be accommodated as new instructions. This combines the efficient and structured control path associated with an instruction processor with the benefits of hand-crafted hardware. The processor and its associated opcodes provide a means of optimising control paths through optimising the compilers.

Critical resources can be increased as demanded by the application domain, and eliminated if not used. Instruction processors provide a structure for these resources to be shared efficiently, and the degree of sharing can be determined at run time.

FIPs enable high-level data structures to be easily supported in hardware and also help preserve current software investments and facilitate the prototyping of novel architectures, such as abstract machines for real arithmetic and declarative programming [13].

In particular, the FIP approach of the present invention enables different implementations of a given instruction set with different design trade-offs. These implementations can also be related by transformation techniques [11], which provide a means of verifying non-obvious, but efficient, implementations.

The efficiency of an implementation is often highly dependent on the style of the processor selected. Specialised processor styles, such as the Three Instruction Machine (TIM) [13], are designed specifically to execute a specific language. Even processor templates which are designed for more general application, such as the stack-based Java Virtual Machine (JVM) or register-based MIPS, are more efficient for different tasks. Hence, for a given application, the selection of the processor style is an important decision. Issues such as the availability of resources, the size of the device and the speed requirements are effected by the decision.

Different styles of processors support different customisable instruction formats. These processors also have different trade-offs in size, speed and ease of hardware re-programmability. For example, register-style implementations of JVM are fast but large, while stack-style implementations of JVM are slower and smaller. A processor library containing information for producing different styles of processors is used in the generation of customised processors at design and run time.

It is also possible to generate new processors and the corresponding code by combining different styles of processors. This allows the systematic development of complex processors and the corresponding codes by combining simpler processors.

Related tools including compilers, assemblers, linkers, disassemblers, debuggers, instruction set simulators and other facilities are provided for optimising performance, reducing size, reducing power consumption, etc. This optimisation can be achieved by, for instance, reducing the frequency of re-configuration or reducing the wire congestion in the programmable hardware.

The present invention supports optimisation by run-time customisation. Run-time customisation includes: (a) reducing resource usage by re-programming the hardware so that only the essential elements are present in the hardware at a particular time; (b) optimising performance and usage by adapting the programmable hardware to run-time conditions not known at design time; and (c) optimising performance and usage by conditionally downloading new code and/or new hardware at run time from an external source, such as the internet.

For a given customisation specification and processor library, an embodiment of the present invention provides means for generating: (a) a plurality of hardware descriptions of a customisable processor, each representing a possible customised version of the processor tuned to specific run-time conditions; (b) customised tools for developing and optimising code executable on the hardware descriptions, and information to allow optimised combination of such code at run time; and (c) hardware and software mechanisms for selecting hardware and code to run at a particular instant at run time. The selection can be decided by the user at design time, or can be influenced by run-time conditions.

As compared to direct hardware implementation, FIPs have the added overhead of instruction fetch and execute. VLIW and EPIC architectures are attempts to reduce the ratio of the number of fetches to the number of executions. Customising instructions is also a technique to reduce the fetch and execute ratio and increase the performance of the FIP. The concept of incorporating custom instructions in a FIP has been reported [4, 10]. Custom instructions are typically hand crafted and incorporated during FIP instancing. While hand-crafted custom instructions provide for the best performance, these instructions are difficult to create, and require a skilled engineer with good knowledge of the system. The present invention provides a technique which automatically creates custom instructions through opcode chaining and other optimisations in order to improve. This technique can be used both at compile time and at run time.

In a preferred embodiment, at run time and for given application data, the hardware and/or software mechanisms can adopt one or both of a different customised processor or a different piece of code containing instructions to deal with application data, depending on the user and/or run-time conditions. The selection can take into account the speed, size, and power consumption of the current and the re-programmed implementations, and also the re-programming time. The compiled code can contain information to enable the creation or retrieval of the corresponding customised processor. If a piece of compiled code is encountered where the customised processor for its execution does not exist, such information will enable, for instance, the processor to be retrieved by loading the same from a network source.

The present invention also provides for the run-time adaptation of FIPs. The run-time adaptability of a FIP system allows the system to evolve to suit the requirements of the user, typically by performing automatic refinement based on instruction usage patterns.

The techniques and tools that have been developed include: (a) a run-time environment that manages the re-configuration of a FIP so as to execute applications as efficiently as possible; (b) mechanisms for accumulating run-time metrics and analysing the metrics to allow the run-time environment to request automatic refinements; and (c) customisation techniques for automatically customising a FIP to an application.

The run-time approach of the present invention is one of a modular framework which is based on FIP templates which capture various instruction processor styles, such as stack-based or register-based styles, enhancements which improve functionality and performance, such as processor templates which provide for superscalar and hybrid operation, compilation strategies involving standard compilers and FIP-specific compilers, and technology-independent and technology-specific optimisations, such as techniques for efficient resource sharing in FPGA implementations.

Predicting the run-time characteristics of a FIP system over a period of time is extremely difficult. For instance, the Advanced Encryption Standard (AES) [17] utilises a range of block sizes for different situations, and thus the processing required is situation dependent. Typically, where a long re-configuration time is undesirable, one can use a generic FIP that supports different AES block sizes moderately efficiently without requiring run-time re-configuration. Otherwise, one can use different FIP implementations which are customised to run different AES modes highly efficiently, and reconfigure the FIP as required.

In one embodiment the FIP system can be automatically re-configured based on instruction usage patterns. For instance, different web sites deploy different encryption methods, and frequent visitors to particular web sites may use FIPs optimised for specific operations.

The present invention provides a FIP run-time adaptation system which provides: (a) a run-time environment which manages the re-configuration of a FIP so as to execute a given application as efficiently as possible; (b) mechanisms for accumulating run-time metrics and analysing the metrics to allow the run-time environment to request automatic refinements; and (c) a customisation system for automatically customising a FIP to an application.

As set out hereinabove, FIPs provide a well-defined control structure which facilitates varying the degree of sharing for system resources. This allows critical resources to be increased as demanded by the application domain, and eliminated if not used. FIPs also provide a systematic method for supporting customisation by allowing user-designed hardware to be accommodated as new instructions. These design-time optimisations provide a means of tailoring an instruction processor to a particular application or to applications for a specific domain, such as image processing.

Run-time adaptation allows for the further fine tuning of FIPs to run-time changes by exploiting the upgradability of re-programmable hardware, such as FPGAs. The present invention provides a FIP framework which simplifies re-configurability by providing a means of refining FIPs at both compile time and run time.

The ability to adapt a FIP system to the changing behaviour of applications is a powerful feature, but there are significant technical requirements to providing a working system. These requirements include: (a) the ability to create a plurality of FIP designs at compile time or run time; (b) managing the library of FIPs; and (c) ensuring that performance of the system is not diminished by providing added flexibility.

In this regard, an approach is developed which encompasses the following components: (i) a design tool for facilitating the creation of customised FIPs at compile time; (ii) a scheme for track available FIP designs and machine code; (iii) a run-time system for managing the FIP state and configuration; (iv) a metric used to decide if re-configuration is a suitable option at a given time; (v) a specification defining which run-time statistics are required for refinement analysis; (vi) a monitor for accumulating run-time statistics; and (vii) a tool for automatically customising a FIP based on the accumulated run-time statistics. Note that optimisation analysis and automatic refinement steps are optional and are included when their overheads can be tolerated.

In one aspect the present invention provides a design system for generating configuration information and associated executable code based on a customisation specification, which includes application information including application source code and customisation information including design constraints, for implementing an instruction processor using re-programmable hardware, the system comprising: a template generator for generating a template for each processor style identified as a candidate for implementation; an analyser for analysing instruction information for each template and determining instruction optimisations; a compiler for compiling the application source code to include the instruction optimisations and generate executable code; an instantiator for analysing architecture information for each template, determining architecture optimisations and generating configuration information, preferably domain-specific configuration information, including the architecture optimisations in order to instantiate the parameters for each template; and a builder for generating device-specific configuration information from the configuration information including the architecture optimisations.

Preferably, the system further comprises: a selector for profiling the configuration information and associated code for each candidate implementation, and selecting one or more optimal implementations based on predeterminable criteria.

Preferably, the application information further includes application data.

More preferably, the application data includes data representative of data to be operated on by the instruction processor.

Still more preferably, the application data includes data representative of a range of run-time conditions.

Preferably, the customisation information further includes at least one custom instruction.

More preferably, each custom instruction can be defined as mandatory or optional.

Preferably, the customisation information further identifies at least one processor style as a candidate for implementation.

Preferably, the system further comprises: a profiler for profiling information in the customisation specification and identifying at least one processor style as a candidate for implementation.

More preferably, the profiled information includes the application source code.

Preferably, the profiler is configured to identify a plurality of processor styles as candidates for implementation.

In one embodiment ones of the processor styles are identified to execute parts of an application, whereby the application is to be executed by combined ones of the processor styles.

Preferably, the profiler is further configured to collect profiling information for enabling optimisation.

Preferably, the profiling information includes frequency of groups of opcodes.

Preferably, the profiling information includes information regarding operation sharing.

Preferably, the profiling information includes information regarding operation parallelisation.

In one embodiment the analyser is configured to utilise the profiling information in analysing the instruction information, and determine the instruction optimisations therefrom.

Preferably, the instruction optimisations include operation optimisations.

More preferably, the operation optimisations include operation sharing optimisations.

More preferably, the operation optimisations include operation parallelisation optimisations.

Preferably, the instruction optimisations include custom instructions.

In one embodiment the analyser is configured to identify candidate instruction optimisations, and determine implementation of the instruction optimisations based on estimations performed by the instantiator.

Preferably, where the estimations from the instantiator provide that the re-programmable hardware cannot be programmed to implement all instructions together during run time, the analyser groups combined ones of instructions into sets of instructions which can be implemented by re-programming of the re-programmable hardware.

In one embodiment the analyser is configured to determine a plurality of implementations for different run-time conditions, each having instruction optimisations associated with the run-time conditions, and generate decision condition information associated with each implementation, which decision condition information enables selection between the implementations depending on actual run-time conditions.

Preferably, where the instruction optimisations cannot provide an implementation which complies with design constraints, the analyser is configured to invoke the profiler to re-profile the customisation specification based on analysis information provided by the analyser.

Preferably, the architecture optimisations performed by the instantiator include pipelining.

Preferably, the architecture optimisations performed by the instantiator include resource replication.

Preferably, the architecture optimisations performed by the instantiator include technology independent optimisations.

Preferably, the technology independent optimisations include removal of unused resources.

Preferably, the technology independent optimisations include opcode assignment.

Preferably, the technology independent optimisations include channel communication optimisations.

Preferably, the technology independent optimisations include customisation of data and instruction paths.

In one embodiment, where a plurality of configurations of the re-programmable hardware are required to implement the instruction processor, the instantiator is configured to optimise ones of the configurations into groups and schedule implementation of the grouped configurations.

Preferably, the system further comprises: a library containing processor definitions and associated parameters for a plurality of processor styles; and wherein the template generator is configured to generate templates from processor definitions and associated parameters extracted from the library.

Preferably, the processor styles include superscalar processors.

Preferably, the processor styles include hybrid processors.

In one embodiment the compiler is generated by the analyser, and the application source code is annotated with customisation information for compilation by the compiler to provide an optimised executable code.

In another embodiment the compiler is configured to compile the application source code and re-organise the compiled source code to incorporate optimisations to provide an optimised executable code.

Preferably, the configuration information and associated executable code, and, where relevant, the decision condition information, are deployed in at least one management system which is for managing adaptation and configuration of instruction processors implemented using re-programmable hardware.

Preferably, the configuration information and associated executable code, and, where relevant, the decision condition information, are deployed in at least one library for enabling re-programming of re-programmable hardware.

In one embodiment the re-programmable hardware comprises at least one field programmable gate array.

In another embodiment the re-programmable hardware comprises at least one complex programmable logic device.

Preferably, the instruction processor is fully implemented using the re-programmable hardware.

In another aspect the present invention provides a method of generating configuration information and associated executable code based on a customisation specification, which includes application information including application source code and customisation information including design constraints, for implementing an instruction processor using re-programmable hardware, the method comprising the steps of: generating a template for each processor style identified as a candidate for implementation; analysing instruction information for each template and determining instruction optimisations; compiling the application source code to include the instruction optimisations and generate executable code; analysing architecture information for each template and determining architecture optimisations; generating configuration information, preferably domain-specific configuration information, including the architecture optimisations in order to instantiate the parameters for each template; and generating device-specific configuration information from the configuration information including the architecture optimisations.

Preferably, the method further comprises the steps of: profiling the configuration information and associated code for each candidate implementation; and in response thereto, selecting one or more optimal implementations based on predeterminable criteria.

Preferably, the application information further includes application data.

More preferably, the application data includes data representative of data to be operated on by the instruction processor.

Still more preferably, the application data includes data representative of a range of run-time conditions.

Preferably, the customisation information further includes at least one custom instruction.

More preferably, each custom instruction can be defined as mandatory or optional.

Preferably, the customisation information further identifies at least one processor style as a candidate for implementation.

Preferably, the method further comprises the steps of: profiling information in the customisation specification; and identifying at least one processor style as a candidate for implementation.

More preferably, the profiled information includes the application source code.

Preferably, a plurality of processor styles are identified as candidates for implementation in the customisation specification profiling step.

In one embodiment ones of the processor styles are identified to execute parts of an application, whereby the application is to be executed by combined ones of the processor styles.

Preferably, profiling information for enabling optimisation is collected in the customisation specification profiling step.

Preferably, the profiling information includes frequency of groups of opcodes.

Preferably, the profiling information includes information regarding operation sharing.

Preferably, the profiling information includes information regarding operation parallelisation.

In one embodiment the instruction information analysis step comprises the steps of: utilising the profiling information in analysing the instruction information; and determining the instruction optimisations therefrom.

Preferably, the instruction optimisations include operation optimisations.

More preferably, the operation optimisations include operation sharing optimisations.

More preferably, the operation optimisations include operation parallelisation optimisations.

Preferably, the instruction optimisations include custom instructions.

In one embodiment the instruction information analysis step comprises the steps of: identifying candidate instruction optimisations; and determining implementation of the instruction optimisations based on estimations performed based on instantiation of the candidate instruction optimisations.

Preferably, where the estimations provide that the re-programmable hardware cannot be programmed to implement all instructions together during run time, the instruction information analysis step comprises the step of: grouping combined ones of instructions into sets of instructions which can be implemented by re-programming of the re-programmable hardware.

In one embodiment the instruction information analysis step comprises the steps of: determining a plurality of implementations for different run-time conditions, each having instruction optimisations associated with the run-time conditions; and generating decision condition information associated with each implementation, which decision condition information enables selection between the implementations depending on actual run-time conditions.

In one embodiment, where the instruction optimisations cannot provide an implementation which complies with design constraints, the instruction information analysis step comprises the step of: invoking the customisation specification profiling step to re-profile the customisation specification based on analysis information provided by the instruction information analysis step.

Preferably, the architecture optimisations include pipelining.

Preferably, the architecture optimisations include resource replication.

Preferably, the architecture optimisations include technology independent optimisations.

More preferably, the technology independent optimisations include removal of unused resources.

More preferably, the technology independent optimisations include opcode assignment.

More preferably, the technology independent optimisations include channel communication optimisations.

More preferably, the technology independent optimisations include customisation of data and instruction paths.

In one embodiment, where a plurality of configurations of the re-programmable hardware are required to implement the instruction processor, the instantiation step comprises the steps of: optimising ones of the configurations into groups; and scheduling implementation of the grouped configurations.

Preferably, each template is generated from processor definitions and associated parameters extracted from a library containing processor definitions and associated parameters for a plurality of processor styles.

Preferably, the processor styles include superscalar processors.

Preferably, the processor styles include hybrid processors.

In one embodiment the compiler utilised in compiling the application source code is generated in the instruction information analysis step, and the compiling step comprises the steps of: annotating the application source code with customisation information; and compiling the annotated source code to provide an optimised executable code.

In another embodiment the compiling step comprises the steps of: compiling the application source code; and re-organising the compiled source code to incorporate optimisations to provide an optimised executable code.

Preferably, the method further comprises the step of: deploying the configuration information and associated executable code, and, where relevant, the decision condition information, in at least one management system which is for managing adaptation and configuration of instruction processors implemented using re-programmable hardware.

Preferably, the method further comprises the step of: deploying the configuration information and associated executable code, and, where relevant, the decision condition information, in at least one library for enabling re-programming of re-programmable hardware.

In one embodiment the re-programmable hardware comprises at least one field programmable gate array.

In another embodiment the re-programmable hardware comprises at least one complex programmable logic device.

Preferably, the instruction processor is fully implemented using the re-programmable hardware.

In a further aspect the present invention provides a management system for managing run-time re-configuration of an instruction processor implemented using re-programmable hardware, comprising: a configuration library containing configuration information for a plurality of instruction processor implementations; a code library for containing associated executable code for the implementations; a loader for loading application data and, as required, configuration information and associated executable code into re-programmable hardware for implementation and execution of an instruction processor; a loader controller for signaling the loader to load application data and, as required, configuration information and associated executable code, and execute the executable code; a run-time monitor for obtaining run-time statistics relating to operation of the instruction processor during execution; an optimisation determiner configured to receive the run-time statistics, and being operable to instruct the loader to load new configuration information and associated executable code for a new implementation into the re-programmable hardware; and an optimisation instructor for invoking the optimisation determiner.

Preferably, the system comprises: a run-time manager including the loader controller, the run-time monitor and the optimisation instructor.

In one embodiment the optimisation instructor is configured automatically to invoke the optimisation determiner on a predeterminable event.

Preferably, the event is an instruction in the executable code.

In one embodiment the optimisation instructor is configured to be invoked by an external agent.

Preferably, the optimisation instructor is configured to be invoked in response to an actuation instruction from an external agent.

Preferably, the optimisation determiner is configured to instruct the loader controller to signal the loader to load the new configuration information and associated executable code into the re-programmable hardware on invocation of the optimisation instructor by the external agent.

Preferably, the actuation instruction identifies the implementation to be implemented using the re-programmable hardware.

Preferably, the configuration information and associated executable code for a new implementation are loaded into the respective ones of the configuration library and the code library prior to invocation of the optimisation instructor by an external agent, such that the configuration information and associated executable code for that implementation can be loaded into the re-programmable hardware on invocation of the optimisation instructor by the external agent.

Preferably, the system further comprises: a decision condition library for containing associated decision condition information for at least ones of the implementations; and wherein the loader is configured to provide the optimisation determiner with decision condition information for a plurality of other implementations for various run-time conditions of the implementation loaded in the re-programmable hardware, and the optimisation determiner is configured to profile the decision condition information for the other implementations, determine whether the decision condition information for any of the other implementations more closely fits the run-time statistics, and, where the decision condition information for one of the other implementations more closely fits the run-time statistics, instruct the loader controller to signal the loader to load the configuration information and associated executable code for that implementation into the re-programmable hardware.

Preferably, the system further comprises: an adapter for generating one or more new implementations optimised to the run-time statistics; and wherein the optimisation determiner is configured to instruct the adapter to generate the one or more new implementations.

In one embodiment the adapter is configured to load the configuration information and associated executable code for each new implementation into respective ones of the configuration library and the code library.

In another embodiment the adapter is configured to load the configuration information, associated executable code and associated decision condition information for each new implementation into respective ones of the configuration library, the code library and the decision condition library.

Preferably, the optimisation determiner is configured to instruct the loader to load the configuration information and associated executable code for a new implementation into the re-programmable hardware on satisfaction of predeterminable criteria.

More preferably, the optimisation determiner is configured to instruct the loader to load the configuration information and associated executable code for a new implementation into the re-programmable hardware where a re-configuration ratio R>1, the re-configuration ratio R being given by the function:

$$R = \frac{T_{sw} \sum_{j=1}^{n} C_{sw,j} F_j}{T_{ci} \sum_{j=1}^{n} (C_{ci,j} F_j) + T_r}$$

Where:
$C_{sw,j}$ is the number of clock cycles to implement a software function $f(\ )$;
$T_{sw}$ is the cycle time for each clock cycle in the clock cycle number $C_{sw,j}$;
$C_{cij}$ is the number of clock cycles to implement a custom instruction;
$T_{ci}$ is the cycle time for each clock cycle in the clock cycle number $C_{ci,j}$; and
$T_r$ is the time required for re-configuration of the re-programmable hardware.

In one embodiment the adapter is configured to operate on line.

In another embodiment the adapter is configured to operate off line.

Preferably, the adapter comprises: an analyser for analysing instruction information based on the run-time statistics and determining instruction optimisations; a compiler for compiling the application source code to include the instruction optimisations and generate executable code; an instantiator for analysing architecture information based on the run-time statistics, determining architecture optimisations and generating configuration information, preferably domain-specific configuration information, including the architecture optimisations; and a builder for generating device-specific configuration information from the configuration information including the architecture optimisations.

Preferably, the adapter further comprises: a selector for profiling the configuration information and associated code for each candidate implementation, and selecting one or more optimal implementations based on predeterminable criteria.

Preferably, the adapter further comprises: a profiler for profiling information in a customisation specification and the run-time statistics, and identifying at least one processor style as a candidate for implementation; and a template generator for generating a template for each processor style identified as a candidate for implementation.

Preferably, the profiled information includes the application source code. Preferably, the profiler is configured to identify a plurality of processor styles as candidates for implementation.

More preferably, ones of the processor styles are identified to execute parts of an application, whereby the application is to be executed by combined ones of the processor styles.

Preferably, the profiler is further configured to collect profiling information for enabling optimisation.

More preferably, the profiling information includes frequency of groups of opcodes.

More preferably, the profiling information includes information regarding operation sharing.

More preferably, the profiling information includes information regarding operation parallelisation.

Preferably, the analyser is configured to utilise the profiling information in analysing the instruction information, and determine the instruction optimisations therefrom.

Preferably, the instruction optimisations include operation optimisations.

More preferably, the operation optimisations include operation sharing optimisations.

More preferably, the operation optimisations include operation parallelisation optimisations.

Preferably, the instruction optimisations include custom instructions.

In one embodiment custom instructions are identified as candidates for optimisation based on frequency of use.

In another embodiment custom instructions are identified as candidates for optimisation based on a decision function D, where the decision function D is given by:

$$D = \max \sum_{j=1}^{n} \frac{T_{sw} C_{sw,j} F_j}{T_{ci} C_{ci,j} F_j} S_j$$

Where:
$C_{sw,j}$ is the number of clock cycles to implement a software function $f(\ )$;
$T_{sw}$ is the cycle time for each clock cycle in the clock cycle number $C_{sw,j}$;
$C_{cij}$ is the number of clock cycles to implement a custom instruction;
$T_{ci}$ is the cycle time for each clock cycle in the clock cycle number $C_{ci,j}$;
$F_j$ is the number of times a procedure is called; and
$S_j$ is a binary selection variable, denoting whether the custom instruction is implemented.

In one embodiment the analyser is configured to identify candidate instruction optimisations, and determine implementation of the instruction optimisations based on estimations performed by the instantiator.

Preferably, where the estimations from the instantiator provide that the re-programmable hardware cannot be programmed to implement all instructions together during run time, the analyser groups combined ones of instructions into sets of instructions which can be implemented by re-programming of the re-programmable hardware.

In one embodiment the analyser is configured to determine a plurality of implementations for different run-time conditions, each having instruction optimisations associated with the run-time conditions, and generate decision condition information associated with each implementation, which decision condition information enables selection between the implementations depending on actual run-time conditions.

Preferably, where the instruction optimisations cannot provide an implementation which complies with design constraints, the analyser is configured to invoke the profiler to re-profile the customisation specification based on analysis information provided by the analyser.

Preferably, the architecture optimisations performed by the instantiator include pipelining.

Preferably, the architecture optimisations performed by the instantiator include resource replication.

Preferably, the architecture optimisations performed by the instantiator include technology independent optimisations.

More preferably, the technology independent optimisations include removal of unused resources.

More preferably, the technology independent optimisations include opcode assignment.

More preferably, the technology independent optimisations include channel communication optimisations.

More preferably, the technology independent optimisations include customisation of data and instruction paths.

Preferably, where a plurality of configurations of the re-programmable hardware are required to implement the instruction processor, the instantiator is configured to optimise ones of the configurations into groups and schedule implementation of the grouped configurations.

Preferably, the adapter further comprises: a library containing processor definitions and associated parameters for a plurality of processor styles; and wherein the template generator is configured to generate templates from processor definitions and associated parameters extracted from the library.

Preferably, the processor styles include superscalar processors.

Preferably, the processor styles include hybrid processors.

In one embodiment the compiler is generated by the analyser, and the application source code is annotated with customisation information for compilation by the compiler to provide an optimised executable code.

In another embodiment the compiler is configured to compile the application source code and re-organise the compiled source code to incorporate optimisations to provide an optimised executable code.

In one embodiment the re-programmable hardware comprises at least one field programmable gate array.

In another embodiment the re-programmable hardware comprises at least one complex programmable logic device.

Preferably, the instruction processor is fully implemented using the re-programmable hardware.

In a yet further aspect the present invention provides a method of managing run-time re-configuration of an instruction processor implemented in re-programmable hardware, comprising the steps of: providing a configuration library containing configuration information for a plurality of instruction processor implementations; providing a code library for containing associated executable code for the implementations; loading application data and, as required, configuration information and executable code into re-programmable hardware for implementation and execution of an instruction processor; executing the executable code; obtaining run-time statistics relating to operation of the instruction processor; and loading new configuration information and associated executable code for a new implementation into the re-programmable hardware.

In one embodiment the loading step is performed automatically on a predeterminable event.

Preferably, the event is an instruction in the executable code.

In one embodiment the loading step is actuated by an external agent.

Preferably, the loading step is actuated in response to an actuation instruction from an external agent.

More preferably, the actuation instruction identifies the implementation to be implemented using the re-programmable hardware.

In one embodiment the method further comprises the step of: loading the configuration information and associated executable code for a new implementation into the respective ones of the configuration library and the code library prior to the loading step; and wherein the loading step comprises the step of: loading the configuration information and associated executable code for that implementation into the re-programmable hardware on actuation by an external agent.

In another embodiment the method further comprises the steps of: providing a decision condition library for containing associated decision condition information for at least ones of the implementations; profiling the decision condition information for a plurality of other implementations for various run-time conditions of the implementation loaded in the re-programmable hardware; determining whether the decision condition information for any of the other implementations more closely fits the run-time statistics; and wherein, where the decision condition information for one of the other implementations more closely fits the run-time statistics, the loading step comprises the step of: loading the configuration information and associated executable code for that implementation into the re-programmable hardware.

In a further embodiment the method further comprises the step of: generating one or more new implementations optimised to the run-time statistics.

In one embodiment the method further comprises the step of: loading the configuration information and associated executable code for each new implementation into respective ones of the configuration library and the code library.

In another embodiment the method further comprises the step of: loading the configuration information, associated executable code and associated decision condition information for each new implementation into respective ones of the configuration library, the code library and the decision condition library.

Preferably, the configuration information and associated executable code for a new implementation are loaded into the re-programmable hardware on satisfaction of predeterminable criteria.

More preferably, the configuration information and associated executable code for a new implementation are loaded into the re-programmable hardware where a re-configuration ratio R>1, the re-configuration ratio R being given by the function:

$$R = \frac{T_{sw} \sum_{j=1}^{n} C_{sw,j} F_j}{T_{ci} \sum_{j=1}^{n} (C_{ci,j} F_j) + T_r}$$

Where:
- $C_{sw,j}$ is the number of clock cycles to implement a software function $f(\ )$;
- $T_{sw}$ is the cycle time for each clock cycle in the clock cycle number $C_{sw,j}$;
- $C_{cij}$ is the number of clock cycles to implement a custom instruction;
- $T_{ci}$ is the cycle time for each clock cycle in the clock cycle number $C_{ci,j}$; and
- $T_r$ is the time required for re-configuration of the re-programmable hardware.

In one embodiment the implementation generating step is performed on line.

In another embodiment the implementation generating step is performed off line.

Preferably, the implementation generating step comprises the steps of: analysing instruction information based on the run-time statistics and determining instruction optimisations; compiling the application source code to include the instruction optimisations and generate executable code; analysing architecture information based on the run-time statistics and determining architecture optimisations; generating configuration information including the architecture optimisations; and generating device-specific configuration information from the configuration information including the architecture optimisations.

Preferably, the implementation generating step further comprises the steps of: profiling the configuration information and associated code for each candidate implementation; and in response thereto, selecting one or more optimal implementations based on predeterminable criteria.

In one embodiment the implementation generating step further comprises the steps of: profiling information in a customisation specification and the run-time statistics; identifying at least one processor style as a candidate for implementation; and generating a template for each processor style identified as a candidate for implementation.

Preferably, the profiled information includes the application source code.

Preferably, a plurality of processor styles are identified as candidates for implementation in the customisation specification profiling step.

More preferably, ones of the processor styles are identified to execute parts of an application, whereby the application is to be executed by combined ones of the processor styles.

Preferably, profiling information for enabling optimisation is collected in the customisation specification profiling step.

More preferably, the profiling information includes frequency of groups of opcodes.

More preferably, the profiling information includes information regarding operation sharing.

More preferably, the profiling information includes information regarding operation parallelisation.

In one embodiment the instruction information analysis step comprises the steps of: utilising the profiling information in analysing the instruction information; and determining the instruction optimisations therefrom.

Preferably, the instruction optimisations include operation optimisations.

More preferably, the operation optimisations include operation sharing optimisations.

More preferably, the operation optimisations include operation parallelisation optimisations.

Preferably, the instruction optimisations include custom instructions.

More preferably, custom instructions are identified as candidates for optimisation based on frequency of use.

Still more preferably, custom instructions are identified as candidates for optimisation based on a decision function D, where the decision function D is given by:

$$D = \max \sum_{j=1}^{n} \frac{T_{sw} C_{sw,j} F_j}{T_{ci} C_{ci,j} F_j} S_j$$

Where:
- $C_{sw,j}$ is the number of clock cycles to implement a software function $f(\ )$;
- $T_{sw}$ is the cycle time for each clock cycle in the clock cycle number $C_{sw,j}$;
- $C_{cij}$ is the number of clock cycles to implement a custom instruction;
- $T_{ci}$ is the cycle time for each clock cycle in the clock cycle number $C_{ci,j}$;
- $F_j$ is the number of times a procedure is called; and
- $S_j$ is a binary selection variable, denoting whether the custom instruction is implemented.

In one embodiment the instruction information analysis step comprises the steps of: identifying candidate instruction optimisations; and determining implementation of the instruction optimisations based on estimations performed based on instantiation of the candidate instruction optimisations.

Preferably, where the estimations provide that the re-programmable hardware cannot be programmed to implement all instructions together during run time, the instruction information analysis step comprises the step of: grouping combined ones of instructions into sets of instructions which can be implemented by re-programming of the re-programmable hardware.

In another embodiment the instruction information analysis step comprises the steps of: determining a plurality of implementations for different run-time conditions, each having instruction optimisations associated with the run-time conditions; and generating decision condition information associated with each implementation, which decision condition information enables selection between the implementations depending on actual run-time conditions.

Preferably, where the instruction optimisations cannot provide an implementation which complies with design constraints, the instruction information analysis step comprises the step of: invoking the customisation specification profiling step to re-profile the customisation specification based on analysis information provided by the instruction information analysis step.

Preferably, the architecture optimisations include pipelining.

Preferably, the architecture optimisations include resource replication. Preferably, the architecture optimisations include technology independent optimisations.

More preferably, the technology independent optimisations include removal of unused resources.

More preferably, the technology independent optimisations include opcode assignment.

More preferably, the technology independent optimisations include channel communication optimisations.

More preferably, the technology independent optimisations include customisation of data and instruction paths.

Preferably, where a plurality of configurations of the re-programmable hardware are required to implement the instruction processor, the instantiation step comprises the steps of: optimising ones of the configurations into groups; and scheduling implementation of the grouped configurations.

Preferably, each template is generated from processor definitions and associated parameters extracted from a library containing processor definitions and associated parameters for a plurality of processor styles.

Preferably, the processor styles include superscalar processors.

Preferably, the processor styles include hybrid processors.

In one embodiment the compiler utilised in compiling the application source code is generated in the instruction information analysis step, and the compiling step comprises the steps of: annotating the application source code with customisation information; and compiling the annotated source code to provide an optimised executable code.

In another embodiment the compiling step comprises the steps of: compiling the application source code; and re-organising the compiled source code to incorporate optimisations to provide an optimised executable code.

In one embodiment the re-programmable hardware comprises at least one field programmable gate array.

In another embodiment the re-programmable hardware comprises at least one complex programmable logic device.

Preferably, the instruction processor is fully implemented using the re-programmable hardware.

Preferred embodiments of the present invention will now be described hereinbelow by way of example only with reference to the accompanying drawings, in which:

FIG. 1 diagrammatically illustrates a FIP design system in accordance with a preferred embodiment of the present invention;

Figure 7:
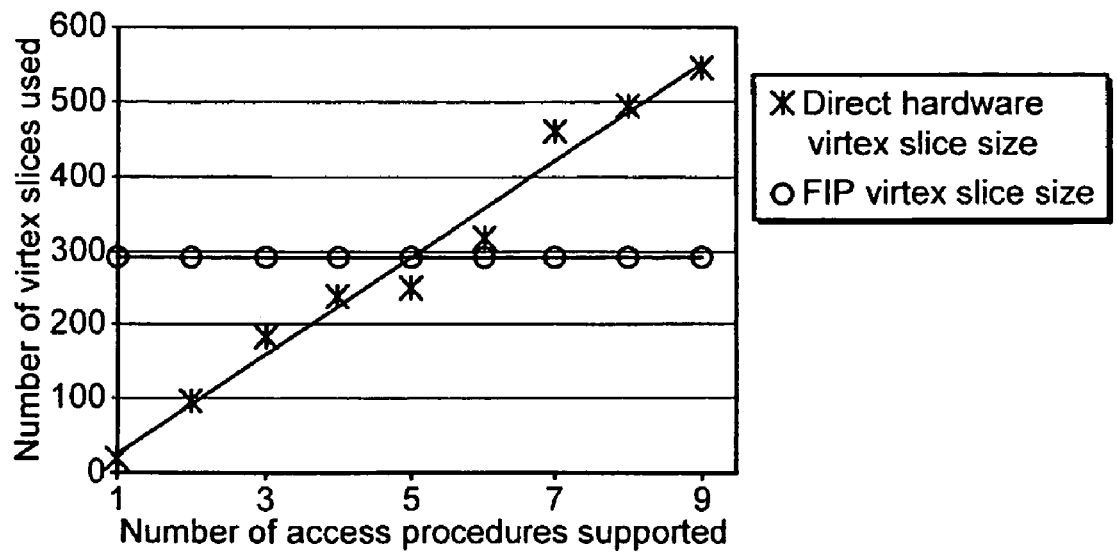
Figure 11:
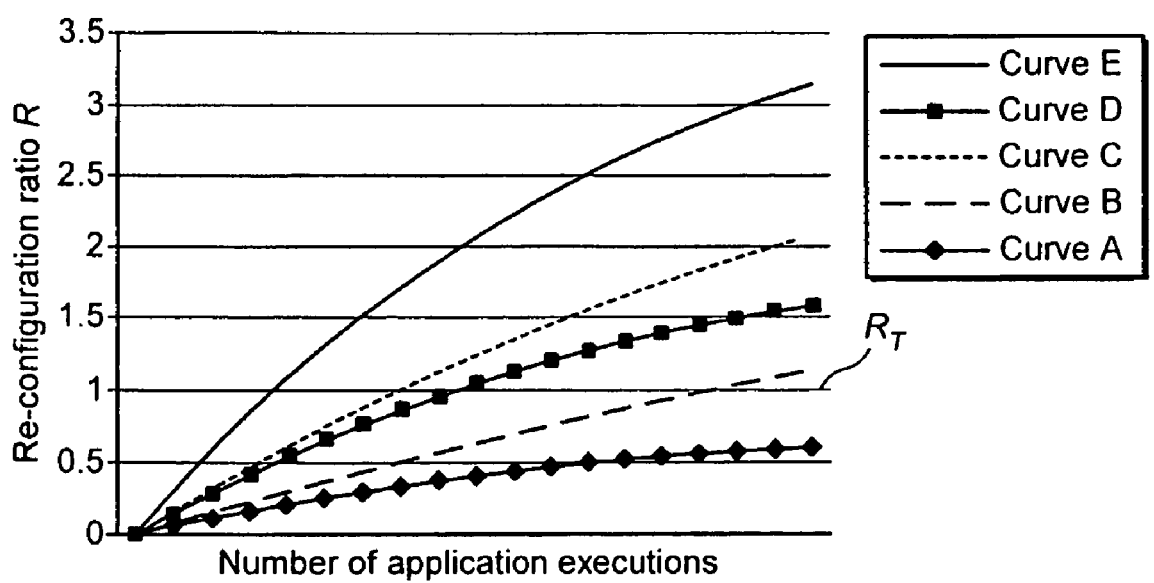
Figure 8:
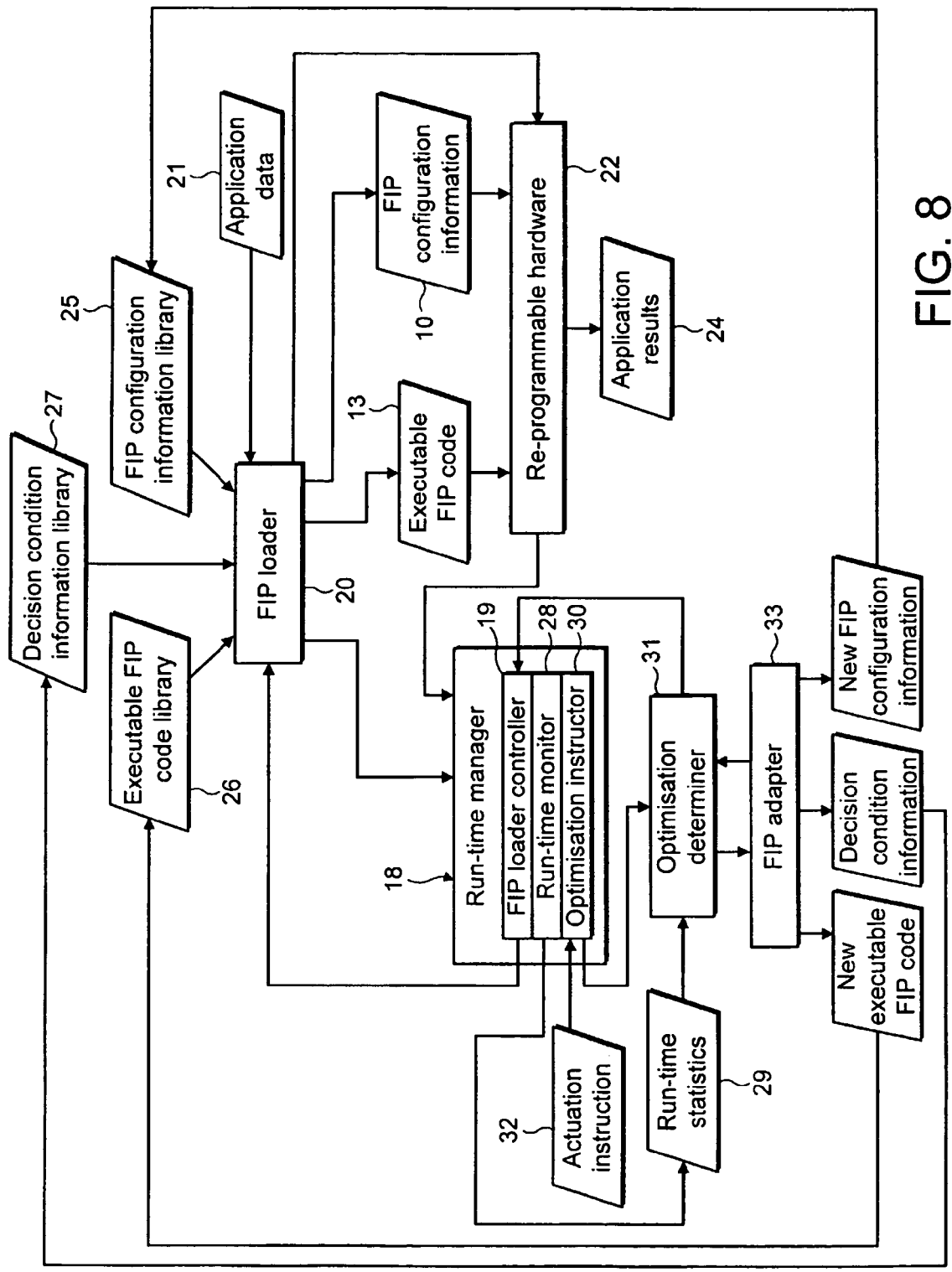
Figure 9:
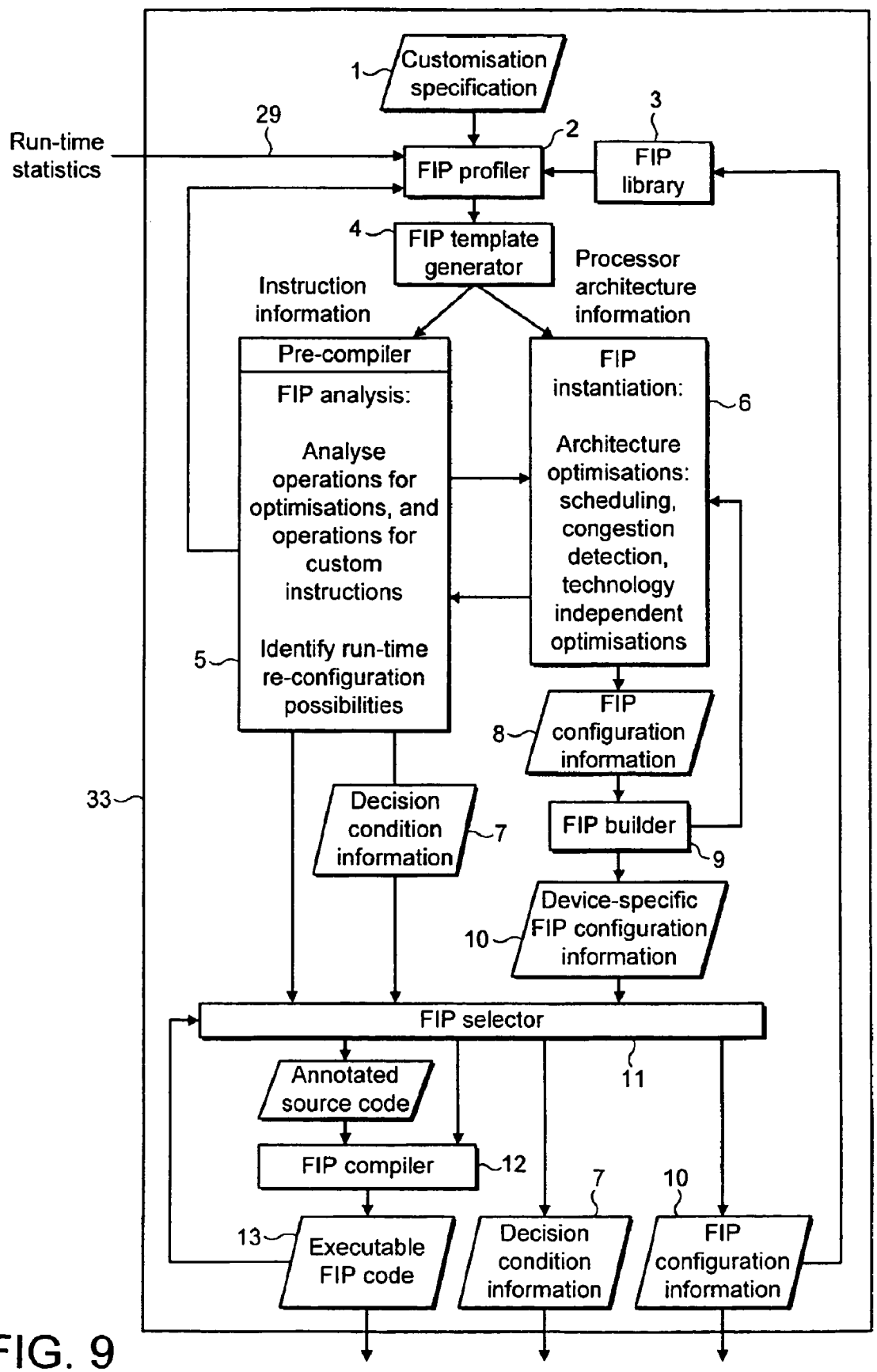
Figure 10:
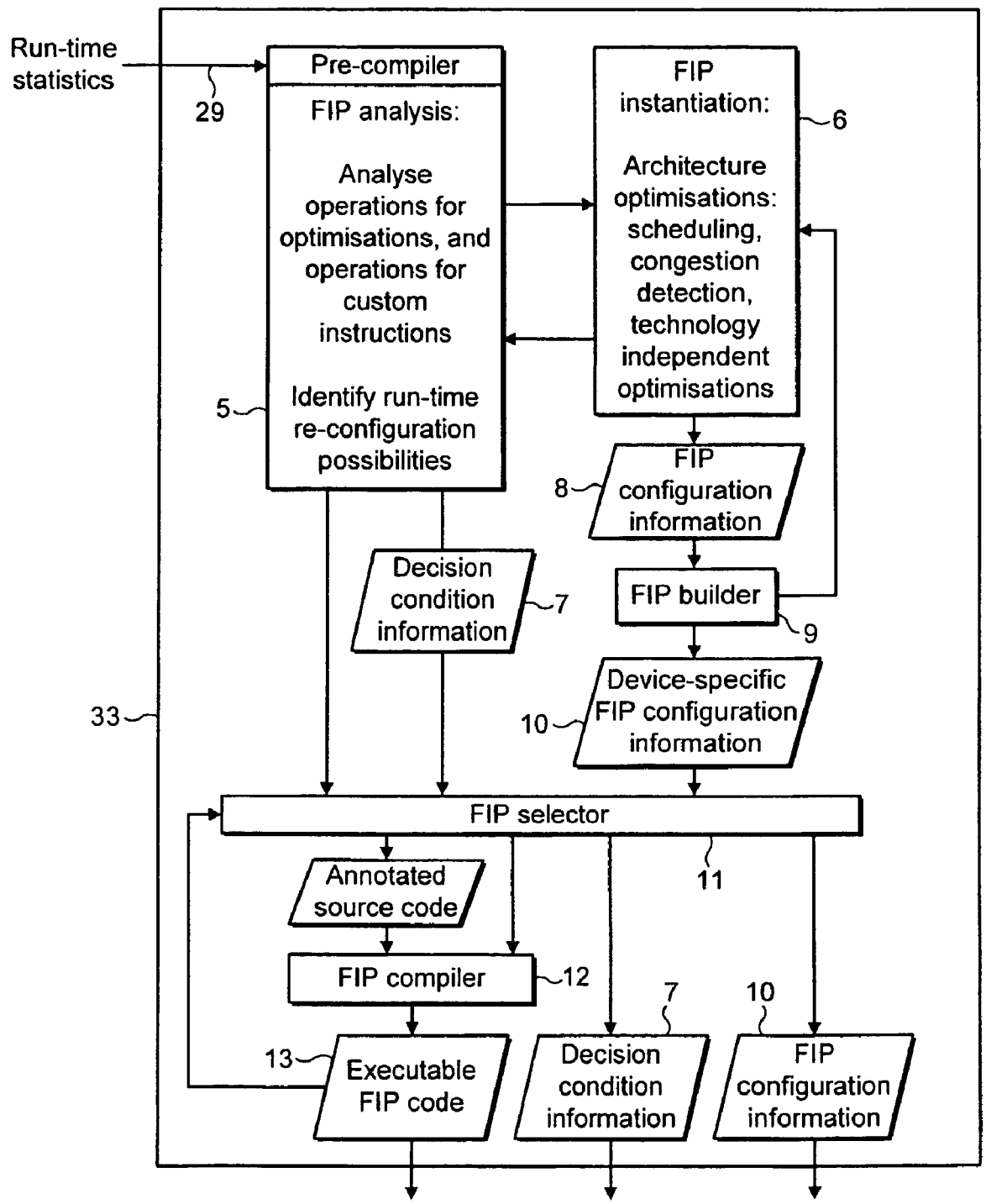
Figures 12, 13:
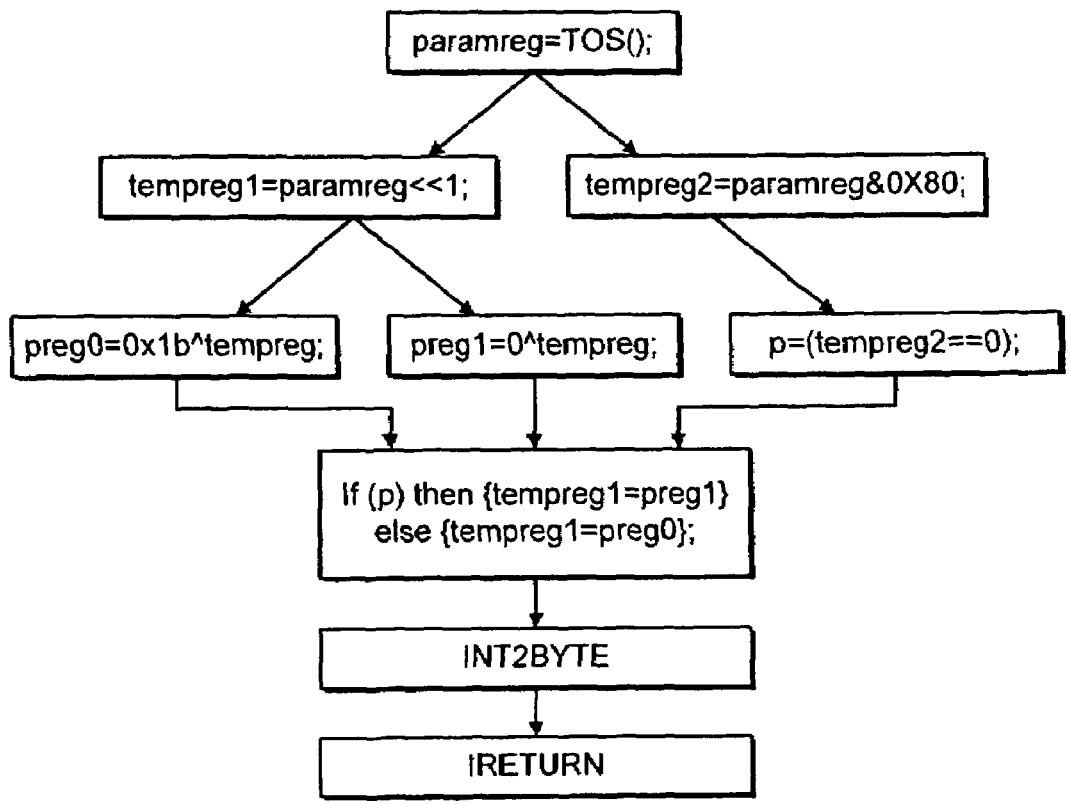
Figure 14:
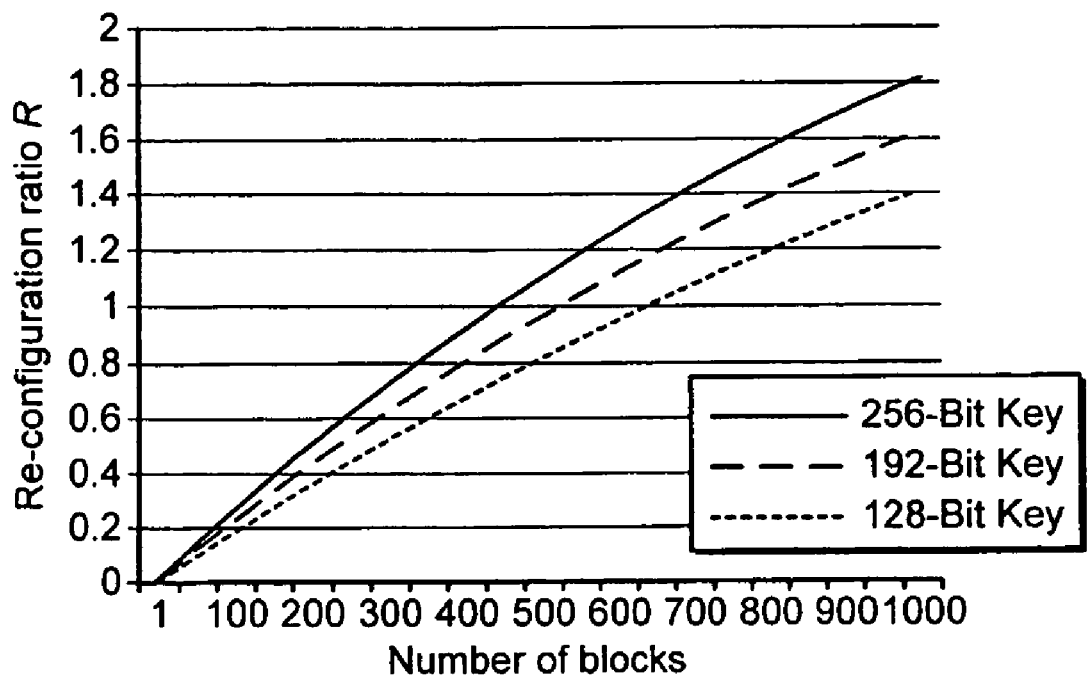
Figure 15:
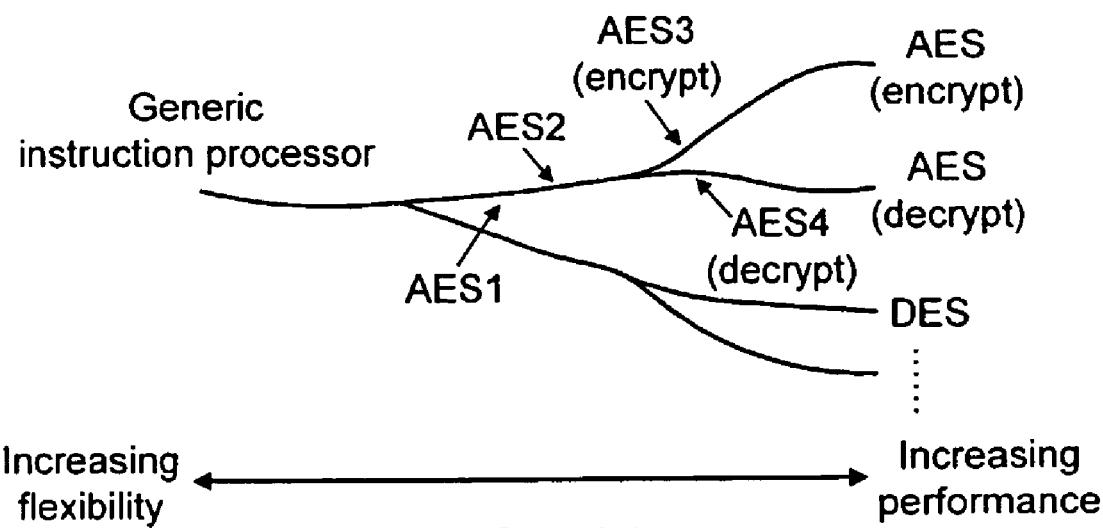
Figures 16, 17:
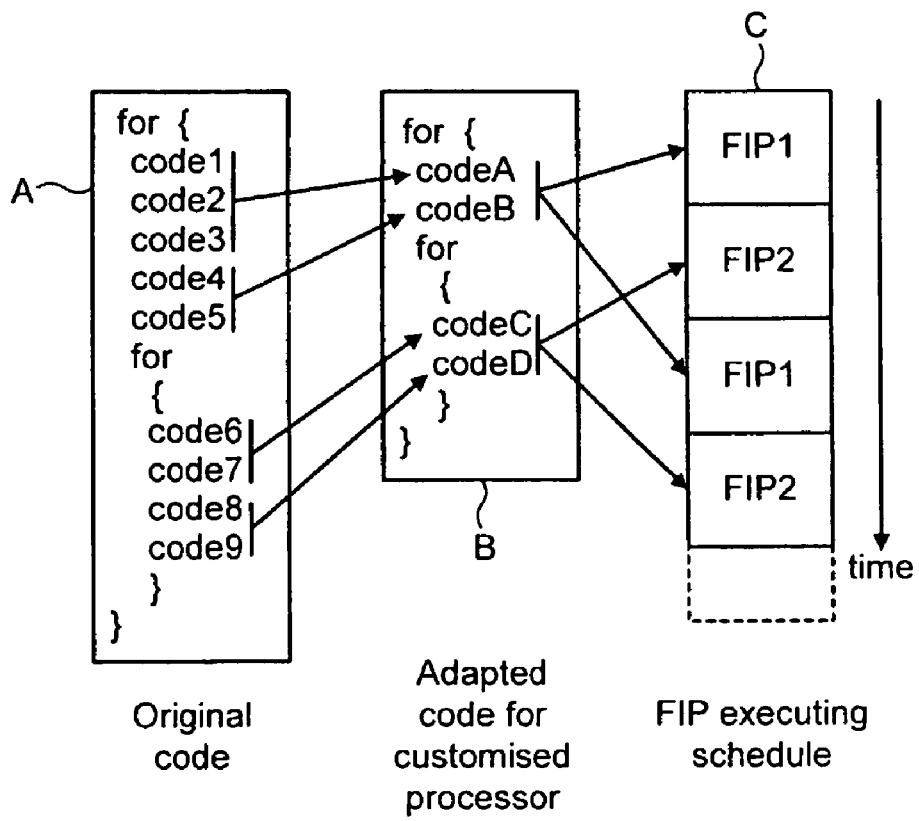
Figure 18:
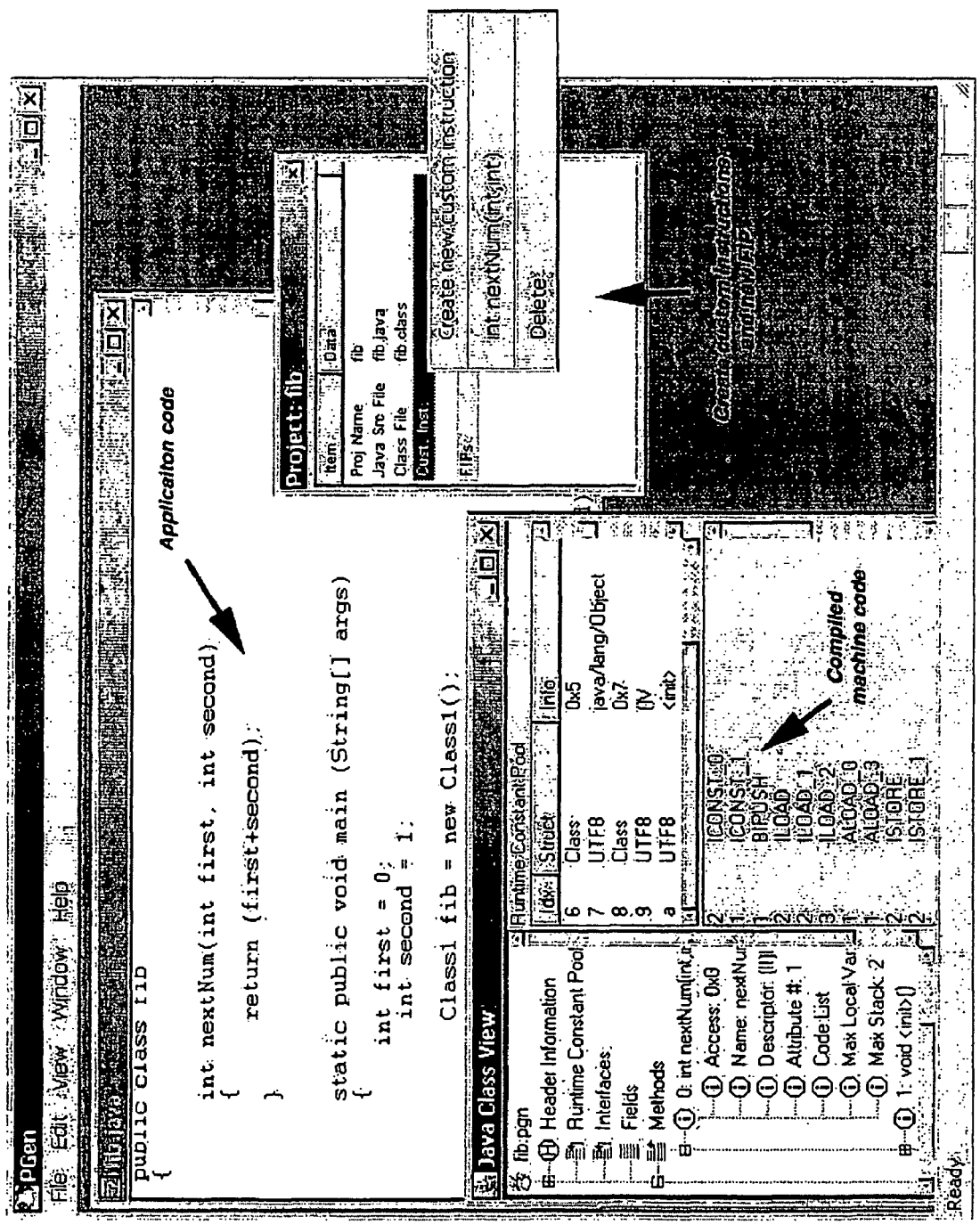

FIG. 7 graphically illustrates the number of virtex slices required as a function of the number of access procedures supported for a FIP implementation in accordance with an embodiment of the present invention and a direct hardware implementation on a Xilinx Virtex XCV1000 device;

FIG. 8 diagrammatically illustrates a FIP management system in accordance with a preferred embodiment of the present invention;

FIG. 9 illustrates the FIP adapter of one embodiment of the FIP management system of FIG. 8;

FIG. 10 illustrates the FIP adapter of another embodiment of the FIP management system of FIG. 8;

FIG. 11 graphically illustrates the influence of various parameters on the re-configuration ratio R as employed by the FIP management system of FIG. 8;

FIG. 12 illustrates the sequential implementation of the procedure FFmulx of the AES algorithm in Java opcodes and chained opcodes as an optimisation;

FIG. 13 illustrates a further optimisation of the procedure FFmulx;

FIG. 14 graphically illustrates the re-configuration ratio R as a function of the number of 128-bit data blocks encrypted by FIPs in accordance with embodiments of the present invention implementing parallel custom instructions for different key widths;

FIG. 15 graphically illustrates the relative performance of FIP implementations for the AES algorithm;

FIG. 16 illustrates the relative speed-ups for the FIP implementations in FIG. 15;

FIG. 17 illustrates a debug tool in accordance with an embodiment of the present invention; and FIG. 18 illustrates a compiler tool in accordance with an embodiment of the present invention.

I—DESIGN-TIME CUSTOMISATION

Figure 1:
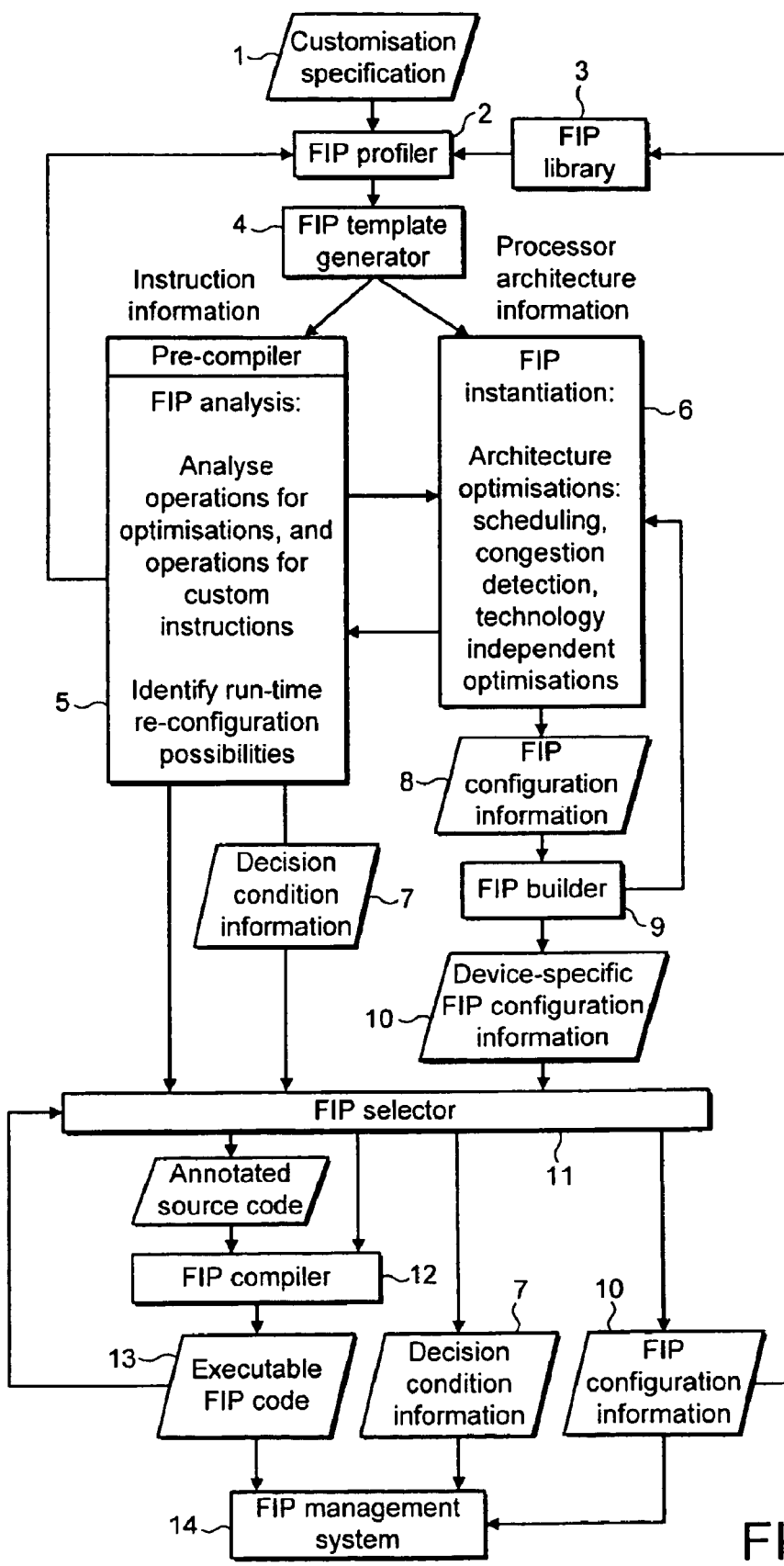

FIG. 1 illustrates a FIP design system in accordance with a preferred embodiment of the present invention.

Customisation Specification

In designing a customised FIP implementation for deployment on re-programmable hardware, such as an FPGA, a customisation specification 1 is first provided.

The customisation specification 1 includes application information, which includes the application source code, which can be in any of several forms, such as C, Java and data-flow graphs, and customisation information, which includes design constraints, such as speed, area and latency, under possibly variable run-time conditions.

In this embodiment the application information also includes application data, which can include data representative of the data to be operated upon by the developed FIP, that is, data representative of the run-time conditions. In a preferred embodiment the application data includes data representative of the entire range of data to be operated upon by the developed FIP. As will become apparent hereinbelow, the provision of such application data enables analysis for a range of run-time conditions.

In this embodiment the customisation information also includes user-defined custom instructions, which define, typically by way of a structural definition, possible custom instructions, either as optional or mandatory instructions.

FIP Profiling

The customisation specification 1 is then subjected to a profiling procedure by a FIP profiler 2.

In the profiling procedure, the application information, in particular the application source code, is profiled to identify one or more candidate FIP styles which would be likely to provide an optimised implementation. For example, candidate selection may be made depending on the style of the application source code. Typically, a stack-based processor is often an efficient processor for descriptions with a large number of small procedures in object-oriented style programming. In one preferred embodiment the profiling procedure compiles the application source code into opcodes for FIP styles. In an alternative embodiment the user may specify candidate FIP styles directly.

When identifying candidate FIP styles, the profiling procedure can identify different FIP styles as possibly being suited to the execution of different parts of the application. Thus, the FIP profiler 2 could propose single FIP styles for the execution of the entire application, or combined ones of a plurality of different FIP styles for the execution of the application, which FIP styles would be achieved by re-configuration during run time, where the re-programmable hardware does not allow for the simultaneous configuration of all of the FIP styles.

In the profiling procedure, profiling information is also collected about the structure of the application source code, in particular the frequency of use of opcodes and groups of opcodes for the FIP styles, and the possible degree of sharing and parallelisation.

Based on the identified candidate FIP styles, the processor definitions and associated parameters for those FIP styles are extracted from a FIP library 3, together with the resources associated with any user-defined custom instructions, such as registers and look-up tables.

FIP Template Generation

FIP templates are then generated automatically by a FIP template generator 4 for each of the identified candidate FIP styles from the processor definitions and associated parameters extracted from the FIP library 3. The FIP templates incorporate the customisation information from the customisation specification 1, such as the user-defined custom instructions.

In this embodiment Handel-C (Version 2.1, [18]), a hardware description language with a C-like syntax, is used to implement the instruction processors. It should, however, be understood that the FIP design system of the present invention is not restricted to Handel-C descriptions, and other hardware description languages could equally be used.

Handel-C enables the entire design process to be maintained at a high level of abstraction, which is advantageous both in the design of the FIP implementation and the inclusion of custom instructions. Handel-C also provides for the rapid prototyping of designs. The present invention is directed particularly at the provision of FIP implementations which are customised for specific applications, particularly lightweight implementations for embedded systems. Using a high-level language, such as Handel-C, simplifies the design process by having a single abstract description and provides a mechanism for demonstrating the correctness of the designed FIP implementations [11, 19].

Figure 2:
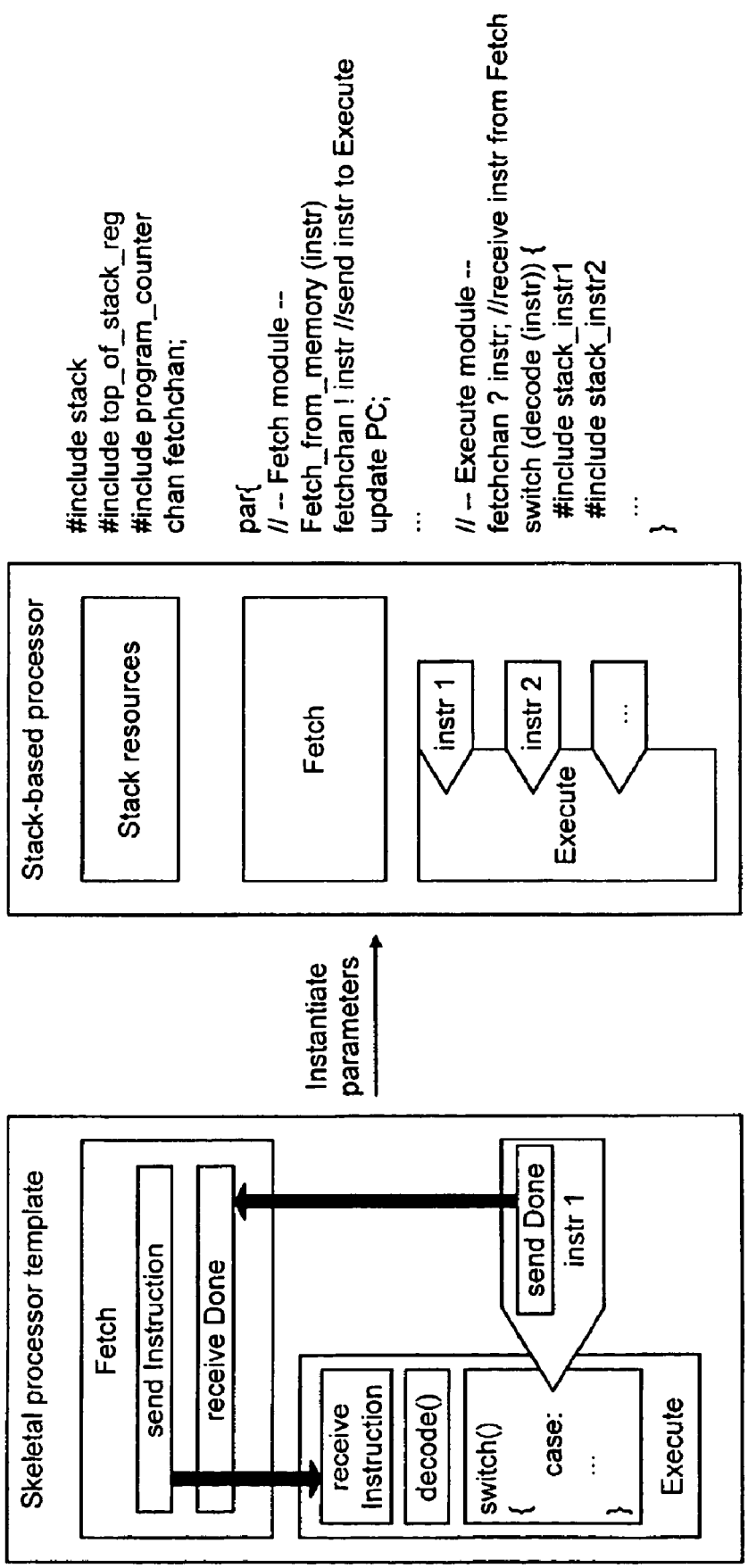
FIG. 2 illustrates a skeletal processor template describing a basic instruction processor, the instantiation of the skeletal processor into a stack processor, and the Handel-C description of the stack processor.

FIG. 2 illustrates a skeletal processor template which describes a basic instruction processor, the instantiation of the skeletal processor into a stack processor, and the Handel-C description of the stack processor.

In the processor template, the Fetch module fetches an instruction from external memory and sends the same to the Execute module, which Fetch module then awaits a signal from the Execute module that the Execute module has completed updating shared resources, such as the program counter. Possible parameterisations include the addition of custom instructions, the removal of unnecessary resources, the customisation of data and instruction paths, the optimisation of opcode assignments, and varying the degree of pipelining.

By way of example, one skeletal template for the processor can be described as follows:

```
// Hardware resources
#include program_counter
chan fetchchan;
int ir_fetch, ir_exe;
par{
// -- Fetch module --
    {
        // Fetch the instruction pointer to the program counter
        ir_fetch = Fetch_from_memory (program_counter);
        // Send previous instruction to the Execute module
        fetchchan ! ir_fetch;
        // Increment the program counter
        program_counter++;
```

-continued

```
    }
// -- Execute module --
    {
        // Receives instruction from the Fetch module
        fetchchan ? ir_exe;
        // Decodes and executes the relevant instruction
        switch (decode (ir_exe));
        {
            // Instruction implementations
        }
    }
}
```

In Handel-C, channel communications are blocked until both sender and receivers are ready. The instructions ! and ? are used to send and receive from channels. For example, fetchchan ! ir_fetch will send the information contained in ir_fetch through the fetchchan channel.

The above-described template describes a basic instruction processor. Modem instruction processors can incorporate many features to enhance efficiency. These features include superscalar architecture, pipelining, interrupts and memory management.

Figure 3:
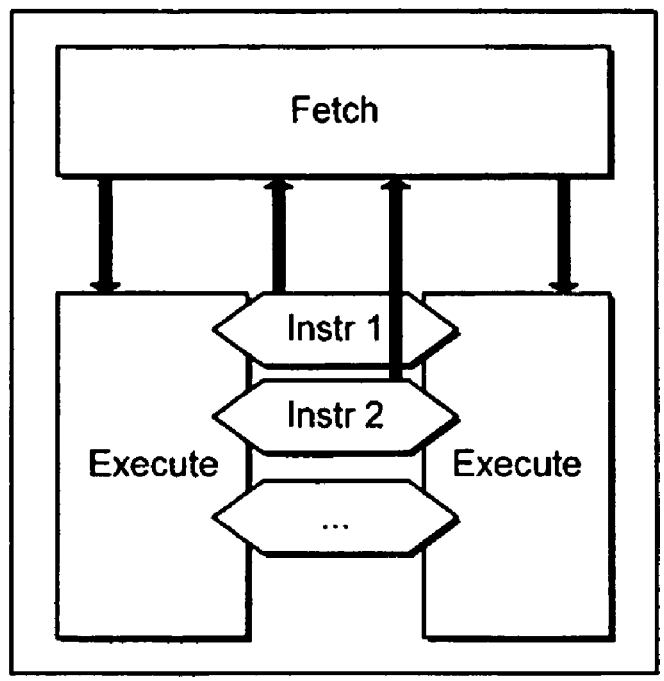
FIG. 3 illustrates a skeletal processor template for a superscalar processor.

FIG. 3 illustrates a skeletal processor template for a superscalar processor.

This processor template comprises a plurality of Execute modules which are interconnected via communication channels in order to maintain the integrity of shared resources.

As will be understood, a superscalar processor provides for the concurrent utilisation of multiple resources. In order to support superscalar architectures, the processor template framework has to provide for the necessary scheduling. Scheduling of instructions can occur either at compile time or dynamically at run time. Where scheduling occurs at compile time, the associated compiler for the processor would be responsible for scheduling. Otherwise, where scheduling occurs dynamically at run time, the Fetch module would incorporate a scheduling algorithm.

This processor template also provides a platform for creating hybrid processors. As will be understood, hybrid processors provide for the ability to execute more than one style of instructions. Current complex processors can often be considered as hybrid processors. Intel® x86 processors, for example, employ a register-based approach for most instructions, while floating-point instructions operate on a stack. In the present invention, hybridisation provides a means of combining the advantages of various processor styles into a FIP implementation.

It is well known that the instructions for different processor styles have different characteristics. For instance, register-based processors tend to have longer instructions and require more program instructions, as compared to the instructions for stack-based processors. Also, register-based instructions allow parallelism to be exploited more easily, whilst stack-based instructions tend to have more dependencies and often run sequentially.

The possibility of combining multiple instruction formats into a single hybrid FIP implementation allows for a trade-off between speed and code size, which may be important for embedded devices with limited storage.

The binary description given to a hybrid FIP implementation may contain instructions packed in the styles of different processors. The Fetch module of such a hybrid FIP implementation would incorporate an additional level of decoding to determine the appropriate style, and channel the instruction to the corresponding Execute module. For example, a hybrid processor may contain both a MIPS Execute module and a TIM Execute module, composed in the same manner as superscalar processors. This hybrid FIP would run MIPS code, but be augmented by the ability to support functional languages.

It is also possible to generate multiple processor systems. In such systems, different instruction streams would feed into each individual FIP, which FIPs may communicate with one another via channels.

As mentioned hereinabove, other advanced processor modules, such as modules for pipelining, interrupt handling and memory management, can also be incorporated into the FIP implementation in a similar way, with the modules interfacing with a standard template using channels. Pipeline communications can be simplified where it is known that a hazard will not arise. Profiling the application domain can provide this information. Speculative execution can also be supported by simultaneously executing both paths of a branch until a guard condition is determined.

At design time, initially no instructions exist in an Execute module. As instructions are added into the Execute module, a counter in the design system is incremented to keep track of the number of instructions that have been added. An opcode file is also generated which provides the mapping between the opcode and its binary representation. In the simplest case, the binary representation of an instruction is the counter number. However, other number schemes could be employed, such as one-hot encoding.

By way of example, the opcode file can take the following form:

define POP 1#define PUSH 2#define MUL 3

Instructions are easily incorporated into an Execute module using #include declarations. By way of example, a stack-based multiply instruction can be included within the switch block of an Execute module as:

include stack_mul.hc

Where, by way of example, the contents of stack_mul.hc could be written as:

```
// Read top of stack
iData1 = readTOS( );
par{
    // Multiply next item in stack to iData
    iData1 *= readStack2( );
    // Adjust the stack pointer
    sp--;
}
par {
    // Write data back into stack
    writeStack(sp-1,iData1);
    // Flag to denote that an instruction has completed execution
    inst__done = 1;
}
```

Custom instructions can also be included in this way by including the instructions in an Execute module, and providing the hardware implementation in a separate file.

The FIP templates are then each processed as follows, with the instruction information for each FIP implementation being subjected to a FIP analysis procedure by a FIP analyser 5 and the architecture information for each FIP implementation being subjected to a FIP instantiation procedure by a FIP instantiator 6.

FIP Analysis

In this embodiment the FIP analyser 5 includes a pre-compiler for the pre-compilation of the application source code; this pre-compilation simplifying the subsequent analysis of the instructions. The output of the pre-compilation can be any intermediate representation, such as data-flow graphs or opcodes. In an alternative embodiment the pre-compiler can be omitted.

For each candidate FIP template, the FIP analyser 5 analyses the profiling information, as obtained by the FIP profiler 2, to identify candidate instruction optimisations, that is, candidate optimisations of operations, typically the sharing and parallelisation possibilities, and operations as candidates for custom instructions, such as by the identification of groups of frequently-used opcodes.

The resulting candidate instruction optimisations are then passed to the FIP instantiator 6 which effects estimations, such as the speed, size and latency, for those optimisations and returns the estimations to the FIP analyser 5.

Based on the estimations received from the FIP instantiator 6, the FIP analyser 5 evaluates the estimations to determine which of the candidate instruction optimisations, that is, operation optimisations and custom instructions, should be incorporated. In one embodiment the FIP analyser 5 evaluates the estimations to determine whether design constraints, for example, as given in the customisation specification 1, are met.

In one embodiment the evaluation by the FIP analyser 5 determines whether the instability in run-time conditions, as represented by the application data in the customisation specification 1, is such that a plurality of FIP implementations are required, each having different instruction optimisations, in order to provide for optimal performance of the application. That is, a plurality of FIP implementations are determined, each being associated with particular run-time conditions. In this embodiment each of the FIP implementations has associated decision condition information 7, which, as will be described hereinbelow, enables a FIP management system subsequently to select between the developed FIP implementations depending on the actual run-time conditions. Where the run-time conditions are extremely stable, for example, in operating on data sets of very similar format, the FIP analyser 5 would probably determine only a single FIP implementation as being necessary.

Where constraints, such as speed or area, make it impossible to implement all instructions in a single FIP configuration, the FIP analyser 5 can group ones of the instructions into different groups, so that only the relevant instruction groups are implemented at a particular time during run time. There are several ways in which this grouping can be implemented. In one implementation, each FIP implementation would have the same number of instructions, the only difference being that some of the instructions would be null instructions, and instead of containing a large hardware description may contain only a small hardware description, requiring that another FIP implementation be loaded. Another implementation is to let the run-time host schedule the re-configuration. In this case, each FIP implementation would still have the same number of instructions, but some of the instructions may be implemented with less area and more latency, for example, in digit serial form. The run-time host can then decide whether it is more efficient to re-configure to a faster FIP implementation, even if the re-configuration time is longer than using a slow operation.

Where the resulting FIP implementations do not comply with predetermined constraints, such as specified in the customisation specification 1, the FIP analyser 5 can be configured, as in this embodiment, to invoke the FIP profiler 2 further to re-profile the customisation specification 1, based additionally on analysis information as provided by the FIP analyser 5, such as to provide modified instruction information, typically by way of providing instruction information for another, possibly-related, FIP style.

FIP Instantiation

For each FIP implementation as determined by the FIP analyser 5, the FIP instantiator 6 develops the one or more FIP hardware configurations which are required to perform the application instructions. The FIP instantiator 6 is also configured to optimise the processor architecture.

As discussed hereinabove, a plurality of FIP hardware configurations are developed where the re-programmable hardware cannot accommodate all of the required FIP hardware configurations at a particular time, with the different FIP hardware configurations being re-programmed on the hardware at different times. Where a plurality of FIP hardware configurations are required, the FIP instantiator 6 is configured both to optimise the construction and scheduling of the FIP hardware configurations, for example, in order to minimise re-configuration.

In this embodiment optimisations include congestion mitigation. Where a resource is used too often, routing congestion in the re-programmable hardware 22 will cause the FIP to slow down and take up more area. The FIP instantiator 6 is configured to detect this condition and invoke techniques to mitigate the problem, such as pipelining the routing or decoding mechanism, and replicating appropriate resources. Where resources are replicated, the FIP analyser 5 is instructed to create new instructions to access the additional resources.

In this embodiment optimisations also include technology independent optimisations, such as removing unused resources, opcode assignment, channel communication optimisations, and customising data and instruction paths according to the specific domain. The size and caching strategy for memory caches or the garbage collection strategies can also be customised.

The FIP instantiator 6 then generates FIP configuration information 8 for each FIP implementation. The FIP configuration information 8 may be specific to a given domain of application, such as image processing.

FIP Building

The domain-specific FIP configuration information 8 for each FIP implementation is then subjected to technology specific optimisations, such as resource binding, constraint satisfaction and instantiation of vendor specific macros, by a FIP builder 9 to provide device-specific FIP configuration information 10, that is, configuration information for the specific FIP implementation and use with specific re-programmable hardware. In particular, any special resources which are available, such as fast-carry chains, embedded memory, etc, are deployed.

The FIP instantiator 6 is iteratively and/or interactively employed if constraints cannot be satisfied.

FIP Selection

The source code, as developed by the FIP analyser 5, and the FIP configuration information 10, as developed by the FIP instantiator 6, for the one or more FIP implementations for each FIP template are then profiled by a FIP selector 11 to select the optimal FIP style, having one or more FIP implementations as described hereinabove, based on predetermined criteria, which criteria usually involve a trade-off between speed and size.

FIP Compilation

Following the selection of one or more FIP implementations by the FIP selector 11, the source code for those implementations is then compiled by a FIP compiler 12 to provide an executable FIP code 13.

Figure 4:
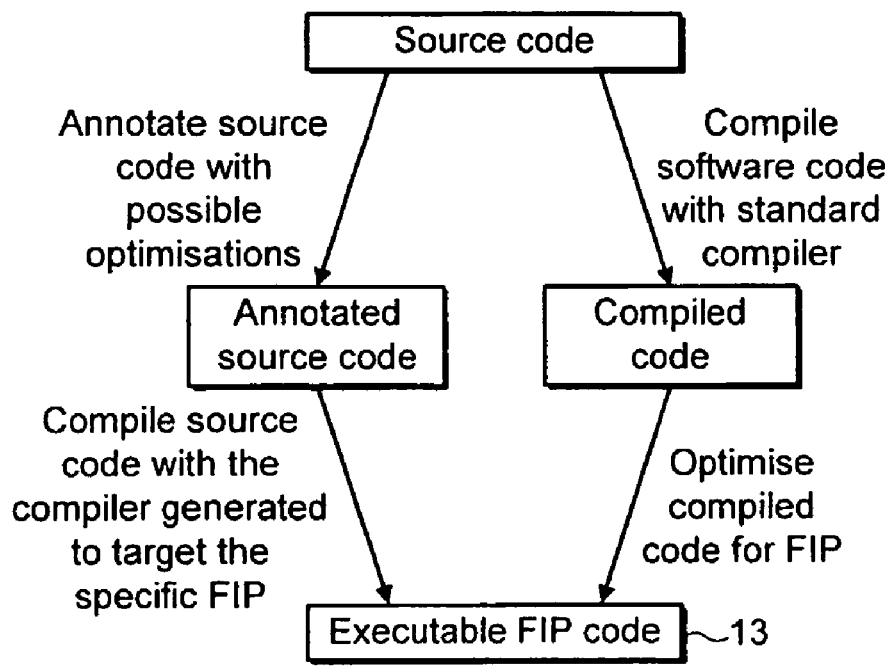
FIG. 4 illustrates two possible compilation paths for the compilation of executable FIP code for FIP implementations in accordance with embodiments of the present invention.

FIG. 4 illustrates two possible compilation paths for the compilation of the executable FIP code 13.

In this embodiment, the left-hand compilation path of FIG. 4, the source code is annotated with information relating to instruction optimisations, such as the frequency of use of instructions and groups of instructions, and shared resources. This step transforms standard source code into source code which includes specific information which is utilised in the optimisation of both the compiled code and the FIP implementation. The advantage of this compilation technique is that no information is lost during the design flow, enabling the optimisation process to be as effective as possible.

In this embodiment the FIP compiler 12 and related tools are generated by the FIP analyser 5, and thus are FIP specific. In this way, the source code, in this embodiment annotated with instruction optimisations, to be utilised by the FIP-specific compiler 12, can be compiled into an executable FIP code 13 and control mechanisms, in a preferred embodiment software control mechanisms, for determining and commissioning at run time the instructions for this FIP implementation optimised for specific durations at run time. The related tools include assemblers, linkers, disassemblers, debuggers, instruction set simulators and other facilities for generating appropriate executable FIP code 13 and optimising performance, reducing size, reducing power consumption, etc. It will be noted that in this embodiment the FIP compiler 12 and the related tools are automatically generated by the FIP analyser 5, for example, based on the requirements of the selected FIP templates and associated parameters.

In an alternative embodiment, the right-hand compilation path of FIG. 4, an available compiler is utilised to compile the source code. This compiler can be a standard compiler or a compiler created from a previous FIP implementation. In this compilation technique, the compiled code is evaluated to determine possible optimisations, and re-organised to exploit instruction-level parallelism and other optimisations. This is similar to the idea of just-in-time compilation (JIT) for JVMs. The advantage of this technique is that existing compilers can be used and pre-compiled code can execute on the FIP. However, since it is often difficult to identify possible optimisations in compiled code, this approach may yield a less optimum solution than using a FIP-specific compiler.

FIP Implementation

The resulting FIP configuration information 10, which can define more than one FIP configuration so as to enable run-time re-configuration, and executable FIP code 13 provide an optimised FIP implementation for the required application. Where a plurality of FIP implementations are developed to provide for optimal performance for varying run-time conditions, each FIP implementation has associated decision condition information 7, as described hereinabove, to enable selection between the FIP implementations depending upon the run-time conditions. Incremental configurations to convert one customised hardware implementation to another can also be created, if appropriate [16].

The developed FIP implementation can then be deployed directly into a FIP management system 14, or alternatively, or in addition, into FIP libraries for subsequent loading into re-programmable hardware. Where a plurality of FIP implementations are developed, one of the FIP implementations is selected for initial deployment, for example, based on providing average performance. Indeed, it is envisaged that the FIP configuration information 10 and the executable FIP code 13, and, where relevant, the decision condition information 7, for the developed FIP implementation could be transferred to a centralised library for subsequent downloading or directly to systems which execute similar applications, thereby providing a means for upgrading those other systems.

Also, in this embodiment, the FIP style and associated parameters for the FIP configuration information 10 for each developed FIP implementation are loaded into the FIP library 3, thereby expanding the number of FIP styles contained in the FIP library 3.

FIP Optimisations

As described hereinabove, optimisations for FIP implementations can occur at two levels, that is, both the software and the processor can be optimised. Advances in optimising compilers and instruction processor designs can be adapted for use in FIP architectures and compilers. Modification of these techniques for use with FIP systems will be described hereinbelow.

Optimisations can be broadly categorised into four groups:

Technology Independent
  Removal of unused resources and instructions
  Customisation of datapaths and instructions
  Optimisation of opcode assignments
  Optimisation of channel communications between modules Technology Dependent (typically for FPGA implementation)
  Deployment of available special resources such as fast-carry chains, embedded memory, etc
  Introduction of congestion management to reduce routing delays due to routing Processor Style Specific
  Processor type, such as JVM, MIPS, TIM
  Superscalar architecture, pipelining, etc Compiler Specific
  Instruction level parallel scheduling
  Opcode re-ordering
  Loop unrolling and folding
  Predicated execution Some of these optimisations have already been developed [11]. The following describes custom instructions and technology dependent optimisations.

Direct hardware implementations of specific data paths can be incorporated into FIP hardware configurations for activation by custom instructions. This improves performance as it reduces the number of fetch and decode instructions. However, the more custom instructions, the larger the FIP hardware configuration. Hence, the improvement in speed is accompanied by an increase in size. The choice of the type and the number of custom instructions is important. This selection should also depend on how frequently a particular custom instruction is used. The trade-offs will be described in more detail hereinbelow.

Furthermore, it is possible to optimise away the fetch and decode stage altogether, leaving only the data path, thereby effectively giving a direct hardware implementation, akin to the hardware implementation described in relation to FIG. 7. With this configuration, problems associated with memory bottlenecks can be obviated.

Optimisations specific to certain processor styles are also possible. These are often related to device dependent resources. For example in a JVM, if multiple banks of memory exist, stack access could be enhanced so that the top two elements of a stack can be read concurrently. Device dependent resources can be exploited by using technology-specific hardware libraries [20] and vendor provided macros, such as Relationally Placed Macros [21] as provided by Xilinx Inc. and Megafunctions [22] as provided by Altera Corporation.

In FPGAs, unlike ASICs, registers are abundant, but routing can incur a large delay penalty, as well as increase the size of a design. This feature of FPGAs places restrictions on template designs. Routing congestion occurs when a resource is used extensively by many operations. Criteria such as the size of the resource or the routing density of neighbouring modules may also effect the routing of a FIP hardware configuration. Three design solutions are presented herein. The first and simplest design solution is to pipeline the routing. The second design solution is to arrange the decoding network, which controls the activation of a resource, as a pipelined tree. This results in a shorter cycle time and a smaller logic-to-routing delay ratio, but at the expense of larger area and more complex circuitry. The third design solution is to replicate the resources. Resources should only be shared where it is beneficial to do so. For example, instructions frequently require temporary registers for intermediate results, so sharing of those resources is inefficient. For shared operations, area and speed can be traded-off against latency. For instance, if the shared resource is a single-cycle multiplier, it can be replaced by several digit-serial multipliers, where parallel to serial converters are placed at locations to reduce the routing congestion. However, if the replicated resource is a shared storage, care needs to be taken to ensure the consistency of the state information.

FIP JVM and MIPS Implementations

Operation of the FIP design system will now be described hereinbelow by way of example with reference to FIP JVM implementations [23], and the performance of those implementations compared against software and ASIC implementations. The performance of a FIP implementation of a MIPS style processor will also be discussed.

The FIP JVM implementations have been developed based on the JVM specification. Many parameterisations and optimisations have been investigated, including the removal of unnecessary resources, the customisation of data and instruction paths, the optimisation of opcode assignments, and the variation of the degree of pipelining. The above-described customised JVMs have been implemented using the RC1000-PP device (Celoxica Limited, UK).

In a first embodiment a FIP JVM has been developed which utilises shared segregated resources. This embodiment provides good area utilisation, but at the expense of speed, because of routing congestion.

In a second embodiment a FIP JVM has been developed which utilises two stages of pipelining and only shares irreplaceable resources, such as the stack and main memory. Stack-based processors are intrinsically sequential. Speed optimisation of the FIP JVM introduces parallelism which is manifested as register-style instruction implementations.

In a third embodiment a FIP JVM has been developed which incorporates deeper pipelines for certain instructions and 'register' style improvements, such as having top-of-stack registers. The top-of-stack registers are replicated. Instructions can be read from different top-of-stack registers, but are written back to the stack directly. Replicated registers are updated during the fetch cycle. Most instructions are processed by four pipeline stages, although certain instructions, such as the instruction for invoking functions, require deeper logic and the implementation of those instructions has been partitioned into five or six pipeline stages. Routing has also been pipelined to reduce the effects of congestion.

These FIP JVM embodiments demonstrate trade-offs between possible parameterisations.

Maximising sharing methods for re-programmable hardware through conventional resource sharing may introduce significant routing overheads. Congestion management is necessary to identify the optimal degree of sharing when the amount of routing begins to dominate the implementation medium.

Pipelining is useful for reducing clock cycle time. However, resources such as stacks may have operation dependencies which limit the amount of overlapping between instructions, and also introduce latency when pipelined.

Figures 5, 6:
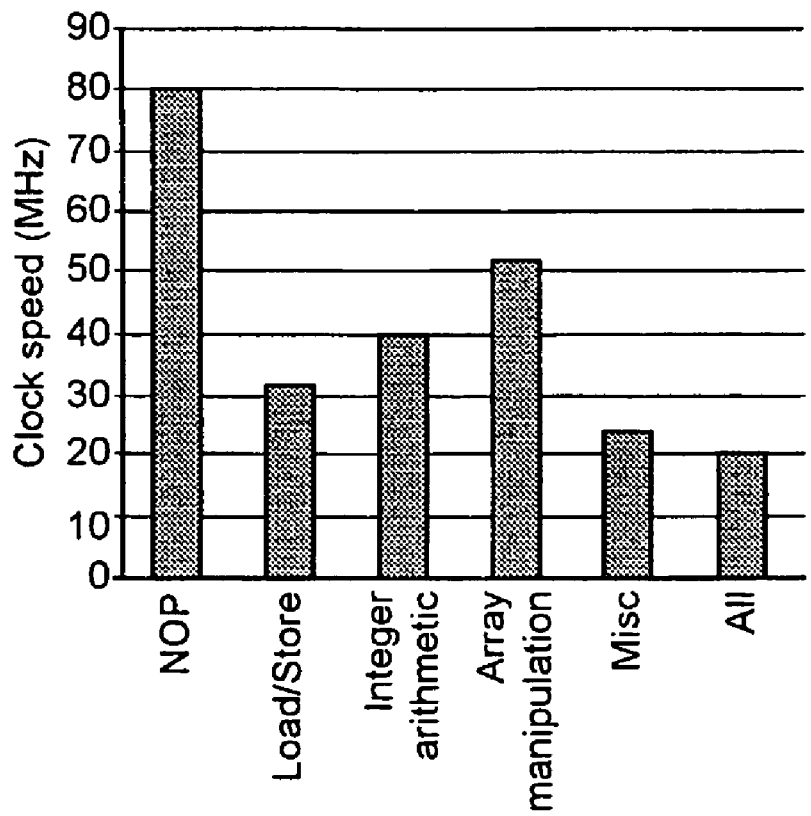
FIG. 5 illustrates the performance of various instructions of a JVM implemented on a Xilinx Virtex XCV1000 device.
FIG. 6 illustrates the benchmark scores of JVMs, including those of FIP JVMs implemented as embodiments of the present invention.

For the following evaluations, the above-described third embodiment of the FIP JVM is utilised, with the current program counter and data path size being 32 bits. As illustrated in FIG. 5, the theoretical upper bound for this implementation is predicted to be roughly 80 MHz, when only the NOP instruction is supported. This demonstrates that the fetch-decoding structure is reasonably efficient. The clock speed could be further increased by reducing the program counter size or improving the adder.

The performance of the FIP JVM is compared with a JVM running on an Intel® processor (Pentium® II at 300 MHz) and an ASIC Java processor (GMJ30501SB at 200 MHz from Helborn Electronics, Segyung, Korea). The GMJ30501SB is based on the picoJava 1 core [24] from Sun Microsystems. The CaffineMark 3.0[25] Java benchmark has been used to measure performance. The CaffineMark 3.0 benchmark is a set of tests used to benchmark performance of JVMs in embedded devices. These include tests on the speed of Boolean operations, execution of function calls and the generation of primes.

FIG. 6 illustrates the benchmark scores of the FIP JVM, together with those achieved with JVM software running on the Intel® processor and the ASIC Java processor. The FIP JVM implementation compares favourably with the software implementation, and a version with a deeper pipeline is estimated to run seven times faster. While the ASIC Java processor achieves the fastest speed, there are two significant factors to be borne in mind. Firstly, the ASIC Java processor is running at 200 MHz, compared to the FIP JVM at 33 MHz. Secondly, the ASIC Java processor has fixed instructions, while the FIP JVM enables the incorporation of custom instructions by re-configuration. The speed-up provided by the FIP JVM is expected to increase towards that shown by the ASIC Java processor as more custom instructions are added. In the following, the trade-offs concerning providing custom instructions are demonstrated.

Link lists may be used to organise e-mails or phone numbers in embedded systems, such as cell phones. Direct hardware implementations, that is, implementations without fetching and decoding instructions, have been developed to manipulate a link list structure having separate circuits supporting different access procedures, such as inserting a link and searching for a value. These direct implementations are clocked at 40 to 70 MHz, and can be incorporated as data paths for custom instructions in the FIP JVM.

An insertion sort algorithm has been written using both the direct hardware approach and the FIP JVM approach for comparison. The direct hardware implementation takes 2.3 ms to sort a list of 100 links, while the FIP JVM takes 6.4 ms and the ASIC JVM is estimated to take 1 ms. The insertion of a link into the list takes 22 Java instructions.

By including a custom instruction to insert a link, the execution time for the FIP JVM can be reduced to 5 ms, since the single custom instruction takes 12 cycles to complete. There is a saving of 10 cycles, and 10 fetch and decode cycles saved per instruction. It will be noted that a custom instruction requiring fewer cycles to execute can be utilised, but the cycle time could be longer. If two custom instructions were added, the execution time would be reduced to 3.1 ms. However, the addition of custom instructions not only speeds up the application, but also increases the size of the FIP hardware configuration. The trade-off of using another FIP implementation will be considered hereinbelow.

For purposes of comparison, a MIPS-style FIP which can be clocked at 30 MHz was developed. Two kinds of comparisons were undertaken. Device-independent comparisons look at the number of gates, registers and latches used. Device-dependent comparisons look at the number of Xilinx Virtex slices used.

FIG. 7 illustrates the trade-offs between a fully-shared FIP implementation and a direct hardware implementation.

In general, the direct hardware implementation executes in fewer cycles and can be clocked at a higher frequency than FIP implementations. For instance, an insert instruction takes 12 cycles at 39 MHz in the direct hardware configuration, as compared to 22 cycles at 30 MHz in a FIP. The direct hardware implementation takes 2.3 ms to sort a list of 100 links, whereas the FIP takes 7.1 ms. However, the FIP uses only 290 Virtex slices, as compared to 460 slices used by the direct hardware implementation.

As will also be noted from FIG. 7, the FIP implementation is smaller than the direct hardware implementation for applications involving five or more access procedures. The cross-over point provides a means of estimating when it is no longer beneficial to include more custom instructions. As more custom instructions are added to the FIP implementation, the cross-over point will shift upwards.

The FIP implementation of the present invention is thus efficient and provides a good mechanism for resource sharing. The execution speed of the FIP could be improved by incorporating custom instructions, but this could be at the expense of size. Furthermore, device-independent results can be utilised to estimate the number and type of custom instructions in a FIP implementation. This provides a means of automating the optimisation of resource sharing. As sharing increases, the amount of routing congestion will also increase, since a larger number of instructions in a FIP implementation may result in more congestion. Custom instructions reduce the number of instructions, hence increasing throughput and reducing congestion.

In summary, the FIP design system of the present invention provides a framework for the systematic customisation of programmable instruction processors. The FIP approach enables rapid development of instruction processors by parameterising, composing and optimising processor templates. Furthermore, either a standard compiler or a FIP-specific compiler can be used in the implementation process.

II—RUN-TIME ADAPTATION

FIG. 8 illustrates a FIP management system in accordance with a preferred embodiment of the present invention.

As described hereinabove, the FIP design system of the present invention provides the FIP configuration information 10 and associated executable FIP code 13, and, where relevant, the associated decision condition information 7, for FIP implementations, and also the corresponding FIP-specific compilers 12. The design environment also generates the initial run-time environment. Users can determine the capability of the run-time environment at compile time. For example, the user can decide whether full re-configuration or automatic refinement is required during run-time. This will determine the complexity of the run-time environment.

The FIP management system includes a run-time manager 18, which is the central hub of the system.

FIP Execution

The run-time manager 18 includes a FIP loader controller 19 for controlling a FIP loader 20.

When instructed to execute an application, the FIP loader controller 19 signals the FIP loader 20 to load application data 21 which is to be operated upon by the FIP, and, as required, FIP configuration information 10, executable FIP code 13, and, where relevant, decision condition information 7, for a FIP implementation, into re-programmable hardware 22, in this embodiment an FPGA, and then execute the FIP code 13 to provide application results 24. Where the required FIP implementation is already loaded in the re-programmable hardware 22, the FIP loader 20 loads only the application data 21.

The FIP configuration information 10, associated executable FIP code 13, and associated decision condition information 7 are obtained from respective ones of a FIP configuration information library 25, an executable FIP code library 26, and a decision condition information library 27. The FIP configuration information library 25 contains a plurality of FIP configuration information files, each for configuring the re-programmable hardware 22 to perform a custom application on the execution of the associated FIP code 13. The executable FIP code library 26 contains a plurality of executable FIP code files, each being associated with a respective one of the FIP configuration information files. The decision condition information library 27 contains a plurality of decision condition information files, each being associated with a respective one of the FIP configuration information files. In this embodiment the libraries 25, 26, 27 are local components of the system, but in an alternative embodiment could be located remotely from the system and the FIP configuration information 10, associated executable FIP code 13 and associated decision condition information 7 for a FIP implementation downloaded as required.

Run-Time Monitoring

The run-time manager 18 further includes a run-time monitor 28, which, during execution of the FIP code 13, obtains run-time statistics 29 relating to the operation of the re-programmable hardware 22, that is, statistics relating to the run-time conditions, such as the number of times each procedure is called, the most frequently used opcodes, and the value of the program counter (PC) to determine execution locality.

In this embodiment the run-time monitor 28 collects run-time data and generates the run-time statistics 29 concurrently with execution of the FIP in order not to impact on the performance of the FIP. Such collection and analysis can be implemented in hardware, such as by an ASIC, or software, such as on a personal computer or a programmable system-on-chip device [4].

The frequency with which such statistics are collected is pertinent [26]. A short sampling period may yield results that do not accurately reflect representative characteristics of an application, whereas a long sampling period may require large amounts of storage space and have an impact on the execution of the application.

The FIP templates utilised in the design of the FIP implementations of the present invention allow for the ready incorporation of statistic monitoring modules. In this embodiment information is collected on the frequency of procedure calls, sampled over the run time of the given application.

Optimisation Determination I

The run-time manager 18 further includes an optimisation instructor 30 for instructing an optimisation determiner 31. The optimisation instructor 30 can be configured to actuate the optimisation determiner 31 automatically, such as in response to an instruction in the executable code, or in response to an actuation instruction 32 from an external agent, such as a user.

The optimisation determiner 31 receives the run-time statistics 29 from the run-time monitor 28, and is operable to instruct the FIP loader controller 19 to signal the FIP loader 20 to load the FIP configuration information 10 and associated executable FIP code 13 for a new FIP implementation into the re-programmable hardware 22.

In one mode of operation, where the optimisation instructor 30 is actuated by an actuation instruction 32 from an external agent and the actuation instruction 32 identifies which FIP implementation is to be implemented, the optimisation determiner 31 instructs the FIP loader controller 19 directly to signal the FIP loader 20 to load the FIP configuration information 10 and associated executable FIP code 13 for a new FIP implementation into the re-programmable hardware 22. Typically, in one embodiment, the FIP configuration information 10, associated executable FIP code 13, and, where relevant, associated decision condition information 7 for one or more new FIP implementations could be loaded into the libraries 25, 26, 27 in anticipation of performing a new custom application, and the optimisation instructor 30 instructed by an external agent to load one of the new FIP implementations.

The optimisation determiner 31 is further configured to determine whether a different FIP implementation would provide for improved run-time performance of the implemented application under the current run-time conditions, these conditions being represented by the run-time statistics 29, such as to enable a new, optimised FIP implementation to be loaded into the re-programmable hardware 22.

In another mode of operation, where the libraries 25, 26 already contain FIP configuration information 10 and associated executable FIP code 13 for FIP implementations of the given application under various run-time conditions, the optimisation determiner 31 simply profiles the decision condition information 7 for those FIP implementations, as available via the run-time manager 18 and the FIP loader 20, and determines whether the decision condition information 7 for any of those FIP implementations more closely fits the obtained run-time statistics 29. Where the decision condition information 7 for one of those FIP implementations more closely fits the obtained run-time statistics 29, the optimisation determiner 31 instructs the FIP loader controller 19 to signal the FIP loader 20 to load the FIP configuration information 10 and associated executable FIP code 13 for that FIP implementation from the libraries 25, 26 into the re-programmable hardware 22. As no compilation of source code or instantiation and building of architecture information is required, and the fact that the FIP implementation was developed so as to provide optimised performance for similar run-time conditions, the implementation of the new FIP is essentially instantaneous and no determination as to the benefit of re-programming the re-programmable hardware 22 has to be performed.

In a further mode of operation, the optimisation determiner 31 is configured to instruct a FIP adapter 33 to generate a new FIP implementation which is more optimally optimised to the run-time conditions for the given application.

In a yet further mode of operation, it is possible to optimise away the fetch and decode stage altogether, leaving only the data path, thereby effectively giving a direct hardware implementation, akin to the hardware implementation described in relation to FIG. 7. With this configuration, problems associated with memory bottlenecks can be obviated.

FIP Adaptation

In one embodiment, as illustrated in FIG. 9, the FIP adapter 33 comprises the components of the above-described FIP design system, as illustrated in FIG. 1, with the run-time statistics 29 being provided as application information to the FIP profiler 2 to enable optimised profiling of the customisation specification 1. In order to avoid unnecessary duplication of description, reference is made to the earlier description of the FIP design system.

In another embodiment, as illustrated in FIG. 10, the FIP adapter 33 comprises components of the above-described FIP design system, as illustrated in FIG. 1. In order to avoid unnecessary duplication of description, only the differences between the FIP adapter 33 and the above-described FIP design system will be described in detail, and reference is made to the earlier description of the FIP design system. The FIP adapter 33 differs from the above-described FIP design system in that the FIP profiler 2, the FIP library 3 and the FIP template generator 4 are omitted, and in that the run-time statistics 29 are provided as application information to the FIP analyser 5 to enable the identification of instruction customisations for the implemented FIP. The FIP adapter 33 of this embodiment represents a simplified version of the FIP adapter 33 of the above-described embodiment, and whilst not being as versatile, offers the advantage of providing for faster adaptation of FIP implementations.

The strategy for adaptation can be influenced by a number of factors, for example, depending on how fast environmental conditions change. Adaptation can be on-line or off-line. On-line adaptation encompasses adapting a FIP implementation for immediate re-configuration and loading the resulting FIP configuration information 10, associated executable FIP code 13, and, where relevant, the decision condition information 7 in the libraries 25, 26, 27 thereby enabling re-programming of the re-programmable hardware 22 in response to quite rapidly-changing environmental conditions. In this system, the FIP adapter 33 would usually be situated closely to the re-programmable hardware 22. Off-line adaptation encompasses adapting a FIP implementation for less immediate re-programming of the re-programmable hardware 22. Such adaptation would be typically where the environmental conditions remain stable or unchanged for relatively long periods of time. In this system, the FIP adapter 33 could be located remotely from the re-programmable hardware 22.

As for the above-described FIP design system, the FIP analyser 5 of the FIP adapter analyses the run-time statistics 29, typically the frequency of use of certain native or custom instructions, and determines possible optimisations, typically in determining the optimal trade-off for a given situation, for instance, in determining the smallest available hardware area at a given speed of execution. Based on the run-time statistics 29, more resources can be dedicated to functions that are used most frequently, for example, by the creation of custom instructions for certain of those functions, or perform various other optimisations, such as using faster operations for more frequently-used instructions, or changing instruction cache size or stack depth. By way of example, the performance of a frequently-used multiplier circuit could be increased, while reducing the area and performance of the less frequently-used operations. The present invention provides a level of flexibility in the optimisation analysis because of the domain specificity.

Custom instructions are created according to the results of the above analysis. Once custom instructions have been generated, the FIP analyser 5 analyses the resulting instructions. This analysis is necessary because, for example, the customisation request may contain too many new custom instructions, and may not satisfy area or latency constraints. In that case, the FIP analyser S determines whether to remove custom instructions, reduce the number of native opcodes supported, or downgrade the performance of the less-frequently used opcodes.

One way of implementing new custom instructions on-line during run time is by using look-up tables. For example, the libraries 25, 26, 27 can include pre-compiled FIPs with custom instructions that take 1, 2 or 3 inputs and give an output. At run time, using appropriate tools such as the "JBits" and "JRTR" tools from Xilinx Inc. [27], the relevant look-up table codes can be uploaded relatively efficiently using partial run-time re-configuration. In one embodiment this approach would utilise information that certain styles of functions are used more frequently, but not necessarily precisely which function. For example, different trigonometric functions can be supported by re-configuring the look-up tables.

Particular optimisations performed by the FIP adapter 33 in the generation of custom instructions include opcode chaining, instruction folding and resource replication. These optimisations will be described in more detail hereinbelow.

Opcode Chaining

The concept of opcode chaining is to connect the sequence of opcodes that make up a procedure. This is similar to the concept of microcode in a RISC machine. Chaining reduces the time spent on fetching and decoding instructions. Further, by converting a procedure call to a single instruction, the overhead of calling a procedure can be avoided; such overheads include pre-amble and post-amble housekeeping routines, such as storing program counters, shared registers and refilling pre-fetch buffers.

Instruction Folding

Instruction folding allows several opcodes to be executed in parallel. For instance, up to four Java opcodes can be processed concurrently [28]. By way of example, in stack-based machines, addition requires two values to be pushed on the stack, and the results may have to be stored after the instruction. A register-based processor can perform all four operations in one cycle if the values have been loaded into the register file. Since operations are chained directly together, there is no need to load values into the register file. The values for an operation would have been loaded as a result of a previous operation.

Resource Replication

Replication of resources enables the utilisation of some level of parallelism which may have previously been hidden. There are two possible approaches, these being data level parallelism and instruction level parallelism [29]. Data level parallelism exploits data independence by performing as many operations as possible in one instruction. Instruction level parallelism involves concurrent operations of independent instructions where processed by different execution units. When creating custom instructions, the available resources are expanded as needed to exploit as much data level or instruction level parallelism as possible.

There are other optimisations which can be employed. These include device-specific optimisations, such as using look-up table implementations. These optimisations exploit high block RAM content, as in the Xilinx Virtex-E (Xilinx Inc.). Also, by moving registers around and removing redundant registers, the overall cycle count of a custom instruction can be reduced. Instruction processors have rigid timing characteristics. The clock period of an instruction processor is determined by the critical delay path, and this means that simple instructions, such as bit manipulation, bit-wise logic and load/store operations, will take at least one cycle to execute. Other possible optimisations relate to reducing the overheads of run-time re-configuration by reducing the amount of configuration storage required to store multiple FIP designs and the time taken to re-configure between these FIP designs [16].

In this embodiment the most frequently used opcodes and groups of opcodes are identified as candidates for optimisation. A large range of possible candidates are thus likely to be identified for creating custom instructions.

In one embodiment, such as for on-line candidate selection, where the selection of candidates has to be made rapidly, a simple decision tree is utilised, typically selecting a predetermined number of the candidate custom instructions having the most frequent usage patterns, while remaining within some size constraint. This technique allows for rapid selection, but may not lead to an optimal optimisation.

In another embodiment, and particularly suited to off-line candidate selection, selection of optimisation candidates is determined by utilising an objective decision function D. This decision is subject to constraints, such as the available area and power, the impact on the current FIP configuration and custom instructions.

In one embodiment the decision function D can take the form:

$$D = \max \sum_{j=1}^{n} \frac{T_{sw} C_{sw,j} F_j}{T_{ci} C_{ci,j} F_j} S_j \quad (1)$$

Where:
- $C_{sw,j}$ is the number of clock cycles to implement a software function $f(\ )$.
- $T_{sw}$ is the cycle time for each clock cycle in the clock cycle number $C_{sw,j}$.
- $C_{ci,j}$ is the number of clock cycles to implement a custom instruction.
- $T_{ci}$ is the cycle time for each clock cycle in the clock cycle number $C_{ci,j}$.
- $F_j$ is the number of times a procedure is called.
- $S_j$ is a binary selection variable, denoting whether the custom instruction is implemented.

Based on the size and performance estimations as provided by the FIP instantiator 6 for the candidate custom instructions, the FIP analyser 5 approves ones of the custom instructions and the FIP adapter 33 proceeds to create the FIP configuration information 10, associated executable FIP code 13, and, where relevant, associated decision condition information 7 for a new FIP implementation, which FIP configuration information 10, associated executable FIP code 13, and, where relevant, associated decision condition information 7 are loaded into the libraries 25, 26, 27. The new FIP implementation, as provided by the FIP configuration information 10, associated executable FIP code 13 and, where relevant, associated decision condition information 7, can then be loaded into the re-programmable hardware 22 when the application is next executed.

Optimisation Determination II (Re-Programming)

Re-programming of the re-programmable hardware 22 can occur as a result of an explicit instruction in the executable FIP code 13, or an actuation instruction 32 to the system at run time, such as by the user pressing a button or keying in re-configuration instructions.

Where the re-programming is dynamic re-programming at run time, if execution data is available prior to the application executing, re-programming may be scheduled at run time. Otherwise, if the re-programmable hardware 22 hosting the FIP is getting full, a scheme such as least recently used (LRU) method may be used to decide which custom instructions are to remain implemented. This can be weighted by information taken from the run-time statistics 29 taken from the run-time monitor 28, so that the more frequently used custom instructions will be least likely to be swapped out.

In this embodiment a simple metric is used to determine whether re-configuration of the re-programmable hardware 22 with a new FIP implementation is beneficial. Where the FIP which is currently operating executes at a particular speed, and a new, faster FIP is proposed as a replacement, the new FIP should only be adopted if the reduction in run time is greater than the re-configuration time.

Consider a software function $f(\ )$ which, when implemented by a 'normal' instruction, requires $C_{sw}$ clock cycles for execution, each having a each cycle time $T_{sw}$, and when implemented as a custom instruction, requires $C_{ci}$ clock cycles for execution, each having a cycle time $T_{ci}$. Where the software function $f(\ )$ is called F times over the time period under investigation, in this embodiment one execution of the application, and the re-configuration time $T_r$ for the re-programmable hardware 22, which includes the time for collecting and analysing data, the execution times for executing the software function $t_{sw}$ and the custom instruction $t_{ci}$ can be given as:

$$t_{sw} = C_{sw} T_{sw} F \quad (2)$$

$$t_{ci} = C_{ci} T_{ci} F \quad (3)$$

A re-configuration ratio R can be defined as follows:

$$R = \frac{t_{sw}}{t_{ci} + T_r} \quad (4)$$

Thus:

$$R = \frac{C_{sw} T_{sw} F}{C_{ci} T_{ci} F + T_r} \quad (5)$$

More generally, with n custom instructions, the re-configuration ratio R becomes:

$$R = \frac{T_{sw} \sum_{j=1}^{n} C_{sw,j} F_j}{T_{ci} \sum_{j=1}^{n} (C_{ci,j} F_j) + T_r} \quad (6)$$

The re-configuration threshold $R_T$ is reached when R=1. For re-configuration to be beneficial, the re-configuration ratio R has to exceed the re-configuration threshold $R_T$. That is, the time taken $t_{sw}$ to execute the FIP code in software, as represented by the top part of the re-configuration fraction, is greater than the time taken $t_{ci}$ to execute the FIP code, which includes custom instructions, for the re-configured FIP plus the re-configuration time $T_r$.

FIG. 11 graphically illustrates the effect of varying different parameters on the re-configuration ratio R. The horizontal axis represents the number of times an application is executed F. The vertical axis represents the re-configuration ratio R.

The lowermost curve, Curve A, represents a base FIP, where $C_{sw}T_{sw}=C_{ci}T_{ci}$. The re-configuration ratio R for the base FIP will never exceed the re-configuration threshold $R_T$, as the reconfiguration time $T_r$ would have to be less than or equal to zero.

Curves B and C represent the base FIP where re-configured to incorporate one and two custom instructions, respectively. The general form of the re-configuration ratio R, as given in equation (6), shows that as more custom instructions are included, the re-configuration threshold $R_T$ can be reached with fewer executions of the application. As more custom instructions are added and generic instructions are removed, the shape of the re-configuration curve will tend towards that of a direct hardware implementation.

Curve D represents the re-configuration ratio R for a FIP incorporating two custom instructions, but operating at half the clock speed of the base FIP, that is, where $2T_{ci}=T_{sw}$.

Curve E represents a FIP with two custom instructions and half the reconfiguration time $T_r$ of the base FIP. Reducing the reconfiguration time $T_r$ by half, increases the initial gradient of the re-configuration curve and reduces the number of application executions required to reach the re-configuration threshold $R_T$. Full re-configuration has been employed in the other exemplified FIPs, but partial re-configuration can be employed. The re-configuration time $T_r$ can be re-written as the product of the re-configuration cycle time $t_r$ and the number of re-configuration cycles $n_r$ required to re-configure the re-programmable hardware 22. By utilising partial re-configuration, the number of re-configuration cycles $n_r$ required can be reduced [26, 30], and hence reduce its effect on the re-configuration ratio R. The number of re-configuration cycles $n_r$ may also be reduced through improvements in technology and architectures that support fast re-configuration though caches or context switches [6, 31, 32].

Implementation

Operation of the run-time management system of the present invention will now be described hereinbelow by way of example with reference to an implementation of the advanced encryption standard (AES-Rijndael) algorithm [17] for the encryption and decryption of information. The AES algorithm is an iterated block cipher with variable block and key length. In this implementation the FIPs are assumed to run at 100 MHz. Also data collection and analysis is conducted in parallel with the FIP execution, and thus does not introduce any performance penalty.

In the AES implementation, the most frequently executed procedure is the procedure FFmulx, a procedure defined by the AES standard. Of all procedure calls, 74% of those calls can be attributed to FFmulx.

The Java implementation of the FFmulx procedure is given hereinbelow.

```
const byte m__poly = 0x16;
public byte FFmulx (byte a)
{
return (byte) ((a<<1) ^
    ((a & 0x80) != 0 ? m__poly : 0));
}
```

FIG. 12 illustrates the sequential implementation of the procedure FFmulx in Java opcodes, and chained and folded opcodes as an optimisation of the base opcodes.

The left-hand column represents the Java opcodes required to implement the procedure FFmulx. In this embodiment the Java opcode implementation takes 26.5 clock cycles on average, plus an additional 4 clock cycles for procedure pre-amble and post-amble routines. Depending on the outcome of the conditional branch IFEQ opcode, this implementation takes from 25 to 28 clock cycles to execute.

The right-hand column represents the result of optimisation by both opcode chaining and instruction folding. Opcode chaining involves storing intermediate results in temporary registers. By removing the need to push and pop values from the stack, the sequential structure imposed by the stack is eliminated. Next, instruction folding is applied. Instruction folding allows several opcodes to be combined or folded into one instruction. In this way, several stack-based instructions are converted into one register-based instruction. Furthermore, since the procedure FFmulx is replaced by a single instruction, there is no longer a need to perform the pre-amble and post-amble routines which are necessary for procedural calls. This optimisation reduces the number of clock cycles in each application execution from about 30 clock cycles to 8.5 clock cycles on average.

FIG. 13 represents a further optimisation of the procedure FFmulx. In this optimisation, custom instructions are executed in parallel by exploiting data dependence. In FIG. 13, instructions on the same level are executed in the same clock cycle, with the arrows denoting the data dependency. This implementation follows ideas in VLIW/EPIC architectures [33], such as multiple issue and predicated execution, and resembles direct hardware implementation. With this optimisation, the cycle count is reduced to 6 cycles.

Using the above optimisations, the original software function for the procedure FFmulx has been optimised from 30 cycles to 6 cycles, producing a five-fold speed-up.

FIG. 14 illustrates a graph of the re-configuration ratio R against the number of 128-bit data blocks encrypted by FIPs implementing parallel custom instructions with different key widths. Re-configuration calculations are based on the time for full re-configuration of the FIP implementation on a Xilinx XCV1000 chip (Xilinx Inc.).

Recall from equation (6) that re-configuration of the re-programmable hardware 22 is beneficial where the re-configuration ratio R greater than one. From FIG. 14, it can be seen that, with a 128-bit encryption key, about 650 blocks of 128-bit data would have to processed before re-configuration would be beneficial. This translates to about 10 Kbytes of data. It will be seen that re-configuration becomes progressively more beneficial as the size of the encryption key increases. With a 192-bit key, about 8.6 Kbytes would have to be processed before re-configuration became beneficial. And, with a 256-bit key, about 7 Kbytes would have to be processed before re-configuration became beneficial.

The AES specification [17] suggests that the AES algorithm could be accelerated by unrolling several of the AES functions into look-up-tables. Speeds of up to 7 Gbits/s have been reported [34] using block RAMs in Xilinx Virtex-E chips (Xilinx Inc.) for such purposes. Custom instructions designed for FIPs can also make use of such techniques.

In this regard, various FIP implementations have been developed to support AES algorithm. FIG. 15 graphically illustrates the relative performance of these FIP implementations, where the key size and block size is 256 bits. FIG. 16 illustrates the speed-ups corresponding to these FIP implementations.

AES1 is a first FIP implementation of the AES algorithm which has been customised by removing hardware associated with unused opcodes in the generic or base FIP, but does not contain any custom instructions.

AES2 is a second FIP implementation of the AES algorithm which incorporates three custom instructions which will speed-up both encryption and decryption. AES2 contains the FFmulx customisation described hereinabove and two additional custom instructions. These three custom instructions speed up both encryption and decryption. The improvement is 1.3 times for encryption and 3.6 times for decryption. The new custom instructions replace the functionality of some opcodes, with the opcodes which are no longer used being removed to provide more area for the custom instructions. Thus, the trade-off is that AES2 is less flexible than AES1, since some routines executable in AES1 may no longer be executable on AES2.

AES3 is a third FIP implementation of the AES algorithm which provides for further refinement in AES encryption. AES3 incorporates a new custom instruction which replaces the inner loop for encryption. More resource is given to the custom instruction that speeds up encryption by utilising look-up-tables, however the two additional custom instructions added in AES2 have to be removed to make space for this new instruction. As a result, the improvement in encryption performance is 5.2 times as compared to AES1, whereas decryption performance is only 1.4 times. The trade-off, however, is that the two additional custom instructions introduced in AES2 have to be removed to make space for this new custom instruction. So, while the encryption speed is improved, this is at the expense of the decryption speed.

AES4 is a fourth FIP implementation of the AES algorithm which provides for refinement of AES decryption. AES4 incorporates a new custom instruction which provides a five-fold decryption speed-up over. AES2, but with similar trade-offs as for AES3.

These results suggest a strategy for re-configuration. Where encryption is used more often than decryption, AES3 should be employed. On the other hand, where decryption is used more often, AES4 should be employed. Where no information about usage is available, AES2 should be employed. Similar optimisation strategies can be applied to applications where the run-time conditions change and favour different FIP implementations at different times.

For implementation of the AES algorithm, initially, a generic FIP, such as a JVM, is used to execute the AES algorithm. At design time, the FIP designer can introduce custom instructions to accelerate the execution of the AES algorithm. After deploying the system, the run-time monitor 28 in the run-time manager 18 would record the execution patterns of the user. Consider that the run-time monitor 28 shows that AES decryption is used more frequently and on larger block sizes than AES encryption. Such a situation would arise, for example, when a user downloads banking information for browsing, and sends back relatively smaller size data for transactions. The optimisation analyser 30 would consequently request optimisation of the FIP implementation. Custom instructions would created by the adaptation unit 31 and the FIP implementation AES4 would be created. The run-time manager would then determine whether it would be advantageous to re-configure to the new FIP implementation.

III—TOOLS

Debug Tools

The debug tool provides a way for users to trace through code in the event of a crash, during simulation or execution. After several adaptations, various FIP configurations could be in use during the execution of an application. The debug tool assists in identifying errors by tracing through the correct FIP design, and provides the ability to expand into custom instructions, revealing the original opcodes that are used to create the custom instruction. FIG. 17 diagrammatically illustrates the debug tool. The left-hand box, box A, contains the original code. The central box, box B, contains the new code, after adaptation. The right-hand box, box C, shows the FIP configuration information 10 and the associated executable FIP code 13. During debug, a user needs to know which FIP is running, and also what opcodes are used to create a custom instruction, such as codeA.

Compiler Tools

FIG. 18 illustrates the compiler tool. The compiler tool allows the user to enter application code and compile the application code into machine code. The compiled code can then be profiled and inspected so that a FIP can be optimised to execute the application. The compiler tool can suggest custom instructions to implement or allow the user to create custom instructions. The right-hand pop-up box illustrates this feature, whereby a user is allowed to create a new custom instruction and a new custom instruction is also proposed by the compiler tool, this being the custom instruction nextNum.

When a FIP design is acceptable, FIP configuration information 10 and the associated executable FIP code 13 is generated for the FIP implementation.

As mentioned earlier, the compiler tool can be used to statically determine re-configuration. In this embodiment the compiler tool also provides a means for the user to specify their re-configuration ratio R and the re-configuration threshold $R_T$ at which re-configuration will be attempted. The compiler tool also allows the user to tune the run-time environment in terms of pre-fetch and re-configuration strategies.

The compiler tool also provides a means for users to provide information which will act as indications in optimising the FIP. By way of example, specification criteria include: (i) load balancing; for example, where a user knows that an adder will be used 60% of the time and a multiplier used only 5% of the time, more resources should be dedicated to the adder, to increase the speed of execution of the FIP; (ii) throughput; that is, the results produced per unit time; (iii) the size of the executable FIP code; and (iv) the size of FIP configuration.

Finally, it will be understood that the present invention has been described in its preferred embodiments and can be modified in many different ways without departing from the scope of the invention as defined by the appended claims.

Further, it is to be understood that the contents of all of the documents cited herein are incorporated by reference.

REFERENCES

[1] H. Styles and W. Luk. Customising graphics applications: techniques and programming interface. In *Proc. IEEE Symp. On Field Programmable Custom Computing Machines.* IEEE Computer Society Press, 2000.

[2] J. A. Fisher. Customized instruction sets for embedded processors. In *Proc. 36th Design Automation Conference,* pp. 253-257, 1999.

[3] Altera Corporation. *Excalibur Embedded Processor Solutions.* http://www.altera.com/html/products/excaliburs-plash.html.

[4] Triscend. *The Configurable System on a Chip.* http://www.triscend.com/products/index.html.

[5] Xilinx. *IBM and Xilinx team to create new generation of integrated circuits.* http://www.xilinx.com/prs_rls/ibm-partner.htm.

[6] U.S. Pat. No. 5,752,035

[7] J. Gray, Building a RISC system in an FPGA. In *Circuit Cellar: The magazine for computer applications*. pp. 20-27, March 2000.

[8] M. J. Wirthlin and K. L. Gilson. The nano processor: a low resource reconfigurable processor. In *Proc. IEEE Symp. on Field Programmable Custom Computing Machines*, pp. 23-30. IEEE Computer Society Press, 1994.

[9] A. Donlin. Self-modifying circuitry—a platform for tractable virtual circuitry. In *Field Programmable Logic and Applications*, LNCS 1482, pp. 199-208. Springer, 1998.

[10] M. Wirthlin and B. Hutchings. A dynamic instruction set computer. In *Proc. IEEE Symp. on Field Programmable Custom Computing Machines*, pp. 99-107. IEEE Computer Society Press, 1995.

[11] I. Page. Automatic design and implementation of microprocessors. In *Proc. WoTUG-17*, pp. 190-204. IOS Press, 1994.

[12] C. Cladingboel. Hardware compilation and the Java abstract machine. M.Sc. Thesis, Oxford University Computing Laboratory, 1997.

[13] C. J. G. North. Graph reduction in hardware. M.Sc. Thesis, Oxford University Computing Laboratory, 1992.

[14] R. Watts. A parameterised ARM processor. Technical Report, Oxford University Computing Laboratory, 1993.

[15] WO-A-00/46704

[16] N. Shirazi, W. Luk and P. Y. K. Cheung. Framework and tools for run-time reconfigurable designs. *IEE Proc.-Comput. Digit. Tech.*, 147(3), pp. 147-152, May 2000.

[17] National Institute of Standards and Technology. *Advanced Encryption Standard*. http://csrc.nist.gov/encrvption/acs.

[18] Celoxica. *Handel-C Production Information*. http://www.celoxica.com.

[19] J. He, G. Brown, W. Luk and J. O'Leary. Deriving two-phase modules for a multi-target hardware compiler. In *Proc. 3rd Workshop on Designing Correct Circuits*. Springer Electronic Workshop in Computing Series, 1996, htt=://www.ewic.org.uk/ewic/workshop/view.cfm/DOC-96.

[20] W. Luk, J. Gray, D. Grant, S. Guo, S. McKeever, N. Shirazi, M. Dean, S. Seng and K. Teo. Reusing intellectual property with parameterised hardware libraries. In *Advances in Information Technologies: The Business Challenge*, pp. 788-795. IOS Press, 1997.

[21] *Xilinx. Relationally Placed Macros.* http://toolbox.xilinx.com/docsan/2_li/data/common/lib/lib2__2.htm.

[22] Altera Corporation. *Megafunctions*. http://www.altera.com/html/mega/mega.html.

[23] T. Lindholm and F. Yellin. *The Java Virtual Machine Specification (2nd Ed.)*. Addison-Wesley, 1999.

[24] Sun Microsystems. *PicoJava™ specification*. http://www.sun.com/microelectronics/picoJava.

[25] Pendragon Software Corporation. *CaffineMark 3.0 Java Benchmark*. http://www.pendragon-software.com/pendragon/cm3/index.html.

[26] N. Shirazi, W. Luk and P. Y. K. Cheung. Run-time management of dynamically reconfigurable designs. In *Field Programmable Logic and Applications*, pp. 59-68, Springer 1998.

[27] S. McMillan and S. A. Guccione. Partial run-time reconfiguration using JRTR. In *Field Programmable Logic and Applications*, LNCS 1896, pp. 352-360. Springer, 2000.

[28] H. McGhan and M. O'Connor. PicoJava: a direct execution engine for Java bytecode. *IEEE Computer*, pp. 22-30, October 1998.

[29] R. Espasa and M. Valero. Exploiting instruction and data level parallelism. *IEEE Micro*, pp. 20-27, September/October 1997.

[30] N. Shirazi, D. Benyamin, W. Luk, P. Y. K. Cheung and S. Guo. Quantitative analysis of FPGA-based database searching. *Journal of VLSI Signal Processing*, pp. 85-96, May/June 2001.

[31] S. Scalera and J. Vázquez. The design and implementation of a context switching FPGA. In *Proc. IEEE. Symp. on Field Programmable Custom Computing Machines*. IEEE Computer Society Press, 1998.

[32] S. Trimberger, D. Carberry, and A. Johnson. A time-multiplexed FPGA. In *Proc. IEEE Symp. on Field Programmable Custom Computing Machines*, pp. 22-28, IEEE Computer Society Press, 1997.

[33] K. V. Palem, S. Talla, and P. W. Devaney. Adaptive explicitly parallel instruction computing. In *Proc. 4th Australasian Computer Architecture Conf. Springer Verlag*, 1999.

[34] M. McLoone and J. McCanny. Single-chip FPGA implementation of the Advanced Encryption Standard algorithm. In *Field Programmable Logic and Applications*. Springer, 2001.

The invention claimed is:

1. A method of generating configuration information and associated executable code based on a customisation specification, which includes application information including application source code and customisation information including design constraints, for implementing a run-time re-configuration of an instruction processor using re-programmable hardware, the method comprising the steps of:

profiling information in the customisation specification to collect profiling information;

identifying at least one processor style, including register-based and stack-based styles, as a candidate for implementation;

generating a template for each processor style identified as a candidate for implementation, each template comprising a processor definition and associated parameters for implementing the respective processor style in the re-programmable hardware, and incorporating the customisation information from the customisation specification, wherein the processor definitions and associated parameters are extracted from a library containing processor definitions and associated parameters for a plurality of processor styles;

analysing instruction information for each template and determining instruction optimisations, wherein the profiling information is utilised in analysing the instruction information, and the instruction information analysis step comprises the steps of:

identifying candidate instruction optimisations;

determining implementation of the instruction optimisations based on estimations performed based on instantiation of the candidate instruction optimisations, wherein, where the estimations provide that the re-programmable hardware cannot be re-programmed to implement all instructions together during run time, combined ones of instructions are grouped into sets which can be implemented by re-programming of the reprogrammable hardware;

determining a plurality of implementations for different run-time conditions, each having instruction optimisations associated with the run-time conditions; and generating decision condition information associated with each implementation, which decision condition information enables selection between the implementations depending on actual run-time conditions;
compiling the application source code to include the instruction optimisations and generate executable code;
analysing architecture information for each template and determining architecture optimisations;
generating first configuration information including the architecture optimisations; and
generating second, device-specific configuration information from the first configuration information including the architecture optimisations.

2. The method of claim 1, further comprising the steps of:
profiling the first configuration information and the executable code for each candidate implementation; and
in response thereto selecting one or more optimal implementations based on predeterminable criteria.

3. The method of claim 1, wherein the customisation information further includes at least one custom instruction.

4. The method of claim 1, wherein, where the instruction optimisations cannot provide an implementation which complies with design constraints, the instruction information analysis step comprises the step of:
invoking the customisation specification profiling step to re-profile the customisation specification based on analysis information provided by the instruction information analysis step.

5. The method of claim 1, wherein the architecture optimisations include pipelining.

6. The method of claim 1, wherein, where a plurality of configurations of the re-programmable hardware are required to implement the instruction processor, further comprising the steps of:
optimising ones of the configurations into groups; and
scheduling implementation of the grouped configurations.

7. The method of claim 1, wherein a compiler utilised in compiling the application source code is generated in the instruction information analysis step, and the compiling step comprises the steps of:
annotating the application source code with customisation information; and
compiling the annotated source code to provide an optimised executable code.

8. The method of claim 1, wherein the compiling step comprises the steps of:
compiling the application source code; and
re-organising the compiled source code to incorporate optimisations to provide an optimised executable code.

9. The method of claim 1, further comprising the step of:
deploying the configuration information and the executable code, and, where relevant, the decision condition information, in at least one management system which is for managing re-configuration of instruction processors implemented using re-programmable hardware.

10. The method of claim 1, further comprising the step of:
deploying the configuration information and the executable code, and, where relevant, the decision condition information, in at least one library for enabling re-programming of re-programmable hardware.

11. A design system with memory for generating configuration information and associated executable code based on a customisation specification, which includes application information including application source code and customisation information including design constraints, for implementing a run-time re-configuration of an instruction processor using re-programmable hardware, the system comprising:
a profiler for profiling information in the customisation specification to collect profiling information and identifying at least one processor style, including stack-based and register-based styles, as a candidate for implementation as a candidate for implementation;
a template generator for generating a template for each processor style, identified as a candidate for implementation, each template comprising a processor definition and associated parameters for implementing the respective processor style in the re-programmable hardware; and incorporating the customisation information from the customisation specification, wherein the processor definitions and associated parameters are extracted from a library containing processor definitions and associated parameters for a plurality of processor styles;
an analyser for analysing instruction information for each template and determining instruction optimisations, wherein the profiling information is utilised in analysing instruction information, and, in analysing instruction information, candidate instruction optimisations are identified, implementation of the instruction optimisations are determined based on estimations performed based on instantiation of the candidate instruction optimisations, wherein, where the estimations provide that the re-programmable hardware cannot be re-programmed to implement all instructions together during run time, combined ones of instructions are grouped into sets which can be implemented by re-programming of the reprogrammable hardware, a plurality of implementations are determined for different run-time conditions, each having instruction optimisations associated with the run-time conditions, and decision condition information associated with each implementation is generated, which decision condition information enables selection between the implementations depending on actual run-time conditions;
a compiler for compiling the application source code to include the instruction optimisations and generate executable code;
an instantiator for analysing architecture information for each template, determining architecture optimisations and generating configuration information including the architecture optimisations; and
a builder for generating device-specific configuration information from the configuration information including the architecture optimisations.

12. A method of managing run-time re-configuration of an instruction processor implemented in re-programmable hardware, comprising the steps of:
providing a configuration library containing configuration information for a plurality of instruction processor implementations;
providing a code library containing executable code for the implementations;
providing a decision condition library for containing associated decision condition information for at least ones of the implementations;
loading application data and, as required, the configuration information and the executable code into re-programmable hardware for implementation and execution of an instruction processor;
executing the executable code;
obtaining run-time statistics relating to operation of the instruction processor;
generating one or more new implementations optimised to the run-time statistics, comprising the steps of:
profiling information in a customisation specification and the run-time statistics;

identifying at least one processor style as a candidate for implementation;

generating a template for each processor style identified as a candidate for implementation;

analysing instruction information based on the run-time statistics and determining instruction optimisations, wherein the profiling information is utilised in analysing the instruction information, and the instruction information analysis step comprises the steps of:

identifying candidate instruction optimisations;

determining implementation of the instruction optimisations based on estimations performed based on instantiation of the candidate instruction optimisations, wherein, where the estimations provide that the re-programmable hardware cannot be re-programmed to implement all instructions together during run time, combined ones of instructions are grouped into sets which can be implemented by re-programming of the reprogrammable hardware;

determining a plurality of implementations for different run-time conditions, each having instruction optimisations associated with the run-time conditions; and generating decision condition information associated with each implementation, which decision condition information enables selection between the implementations depending on actual run-time conditions;

compiling application source code to include the instruction optimisations and generate executable code;

analysing architecture information based on the run-time statistics and determining architecture optimisations;

generating first configuration information including the architecture optimisations;

profiling the first configuration information and the executable code for each candidate implementation to select one or more optimal implementations based on predefined criteria; and generating second, device-specific configuration information from the first configuration information including the architecture optimisations; and loading the configuration information and the executable code for a new implementation into the re-programmable hardware.

13. The method of claim 12, wherein the loading step is performed automatically on a predeterminable event.

14. The method of claim 12, wherein the loading step is actuated by an external agent.

15. The method of claim 14, further comprising the step of:
loading the configuration information and the executable code for a new implementation into the respective ones of the configuration library and the code library prior to the loading step; and
wherein the loading step comprises the step of loading the configuration information and the executable code for that implementation into the re-programmable hardware on actuation by an external agent.

16. The method of claim 12, further comprising the steps of:
profiling the decision condition information for a plurality of other implementations for various run-time conditions of the implementation loaded in the re-programmable hardware;
determining whether the decision condition information for any of the other implementations more closely fits the run-time statistics; and
wherein, where the decision condition information for one of the other implementations more closely fits the run-time statistics, the loading step comprises the step of:
loading the configuration information and the executable code for that implementation into the re-programmable hardware.

17. The method of claim 12, further comprising the step of:
loading the configuration information and the executable code for each new implementation into respective ones of the configuration library and the code library.

18. The method of claim 12, further comprising the step of:
loading the configuration information, the executable code and the decision condition information for each new implementation into respective ones of the configuration library, the code library and the decision condition library.

19. The method of claim 12, wherein the configuration information and the executable code for a new implementation are loaded into the re-programmable hardware on satisfaction of predefined criteria.

20. The method of claim 12, wherein, where the instruction optimisations cannot provide an implementation which complies with design constraints, the instruction information analysis step comprises the step of:
invoking the customisation specification profiling step to re-profile the customisation specification based on analysis information provided by the instruction information analysis step.

21. The method of claim 12, wherein the architecture optimisations include pipelining.

22. The method of claim 12, wherein, where a plurality of configurations of the re-programmable hardware are required to implement the instruction processor, further comprising the steps of:
optimising ones of the configurations into groups; and
scheduling implementation of the grouped configurations.

23. The method of claim 12, wherein each template is generated from processor definitions and associated parameters extracted from a library containing processor definitions and associated parameters for a plurality of processor styles.

24. The method of claim 12, wherein a compiler utilised in compiling the application source code is generated in the instruction information analysis step, and the compiling step comprises the steps of:
annotating the application source code with customisation information; and
compiling the annotated source code to provide an optimised executable code.

25. The method of claim 12, wherein the compiling step comprises the steps of:
compiling the application source code; and
re-organising the compiled source code to incorporate optimisations to provide an optimised executable code.

26. A management system with memory for managing run-time re-configuration of an instruction processor implemented using re-programmable hardware, comprising:
a configuration library for containing configuration information for a plurality of instruction processor implementations;
a code library for containing executable code for the implementations;
a decision condition library for containing associated decision condition information for at least ones of the implementations;
a loader for loading application data and, as required, the configuration information and the executable code into re-programmable hardware for implementation and execution of an instruction processor;

a loader controller for signaling the loader to load application data and, as required, the configuration information and the executable code, and execute the executable code;

a run-time monitor for obtaining run-time statistics relating to operation of the instruction processor;

an optimisation determiner configured to receive the run-time statistics, and being operable to instruct the loader to load the configuration information and the executable code for a new implementation into the re-programmable hardware;

an adapter for generating one or more new implementations optimised to the run-time statistics, wherein the optimisation determiner is configured to instruct the adapter to generate the one or more new implementations;

a profiler for profiling information in a customisation specification and the run-time statistics and identifying at least one processor style as a candidate for implementation;

a template generator for generating a template for each processor style identified as a candidate for implementation;

an analyser for analysing instruction information based on the run-time statistics and determining instruction optimisations, wherein the profiling information is utilised in analysing instruction information, and, in analysing instruction information, candidate instruction optimisations are identified, implementation of the instruction optimisations are determined based on estimations performed based on instantiation of the candidate instruction optimisations, wherein, where the estimations provide that the re-programmable hardware cannot be re-programmed to implement all instructions together during run time, combined ones of instructions are grouped into sets which can be implemented by re-programming of the reprogrammable hardware, a plurality of implementations are determined for different run-time conditions, each having instruction optimisations associated with the run-time conditions, and decision condition information associated with each implementation is generated, which decision condition information enables selection between the implementations depending on actual run-time conditions;

a compiler for compiling application source code to include the instruction optimisations and generate executable code;

an instantiator for analysing architecture information based on the run-time statistics, determining architecture optimisations and generating first configuration information including the architecture optimisations;

a selector for profiling the first configuration information and the executable code for each candidate implementation and selecting one or more optimal implementations based on predefined criteria; and a builder for generating second, device-specific configuration information from the first configuration information including the architecture optimisations; and an optimisation instructor for invoking the optimisation determiner.

* * * * *